(12) United States Patent
Park et al.

(10) Patent No.: US 11,102,893 B2
(45) Date of Patent: Aug. 24, 2021

(54) DISPLAY DEVICE

(71) Applicant: Samsung Display Co., Ltd., Yongin-si (KR)

(72) Inventors: Jae Chun Park, Seoul (KR); Changmin Park, Gwangmyeong-si (KR); Sang Wol Lee, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 16/671,711

(22) Filed: Nov. 1, 2019

(65) Prior Publication Data
US 2020/0275561 A1 Aug. 27, 2020

(30) Foreign Application Priority Data

Feb. 25, 2019 (KR) .................. 10-2019-0021976

(51) Int. Cl.
| | |
|---|---|
| *H05K 7/02* | (2006.01) |
| *H05K 7/04* | (2006.01) |
| *H05K 5/00* | (2006.01) |
| *H01L 27/32* | (2006.01) |
| *H01L 51/00* | (2006.01) |
| *H01L 51/52* | (2006.01) |

(Continued)

(52) U.S. Cl.
CPC ......... *H05K 5/0017* (2013.01); *H01L 27/323* (2013.01); *H01L 27/3244* (2013.01); *H01L 51/0097* (2013.01); *H01L 51/524* (2013.01); *H05K 5/0004* (2013.01); *H05K 5/0226* (2013.01); *G06F 3/0442* (2019.05); *G06F 2203/04102* (2013.01); *H01L 2251/5338* (2013.01)

(58) Field of Classification Search
USPC ....................................... 361/809
See application file for complete search history.

(56) References Cited

U.S. PATENT DOCUMENTS 9,310,633 B2   4/2016 Lee
10,090,478 B2  10/2018 Ahn et al.
(Continued)

FOREIGN PATENT DOCUMENTS

KR   10-2008-0105809   12/2008
KR   10-2015-0004118    1/2015
(Continued)

OTHER PUBLICATIONS

Extended European Search Report dated Jul. 7, 2020, in European Patent Application No. 20150648.2.

*Primary Examiner* — Hung S. Bui
(74) *Attorney, Agent, or Firm* — H.C. Park & Associates, PLC

(57) ABSTRACT

A display device including a display module, a supporting portion disposed below the display module, a plurality of protruding portions protruding from an edge of the supporting portion, and a case containing the display module, the supporting portion, and the protruding portions. The case includes a bottom portion disposed below the supporting portion and a sidewall portion spaced apart from an edge of the display module and extended along the edge of the display module. The protruding portions protrude outward relative to the edge of the display module and are adjacent to the sidewall portion.

26 Claims, 29 Drawing Sheets

(51) Int. Cl.
  *H05K 5/02* (2006.01)
  *G06F 3/044* (2006.01)

(56) References Cited

U.S. PATENT DOCUMENTS

| | | |
|---|---|---|
| 10,143,098 B1 | 11/2018 | Lee |
| 10,409,332 B2 * | 9/2019 | Mizoguchi ............ G06F 1/1683 |
| 2010/0315769 A1 | 12/2010 | Mathew et al. |
| 2015/0016033 A1 | 1/2015 | Choi |
| 2018/0196467 A1 * | 7/2018 | Watamura ............. G06F 1/1683 |
| 2018/0204416 A1 | 7/2018 | Perea-Ochoa |
| 2019/0033920 A1 * | 1/2019 | Yun ...................... G06F 1/1652 |
| 2019/0090364 A1 * | 3/2019 | Shin ..................... G06F 1/1681 |

FOREIGN PATENT DOCUMENTS

| | | |
|---|---|---|
| KR | 10-2016-0019597 | 2/2016 |
| KR | 10-1859966 | 5/2018 |

\* cited by examiner

FIG. 1
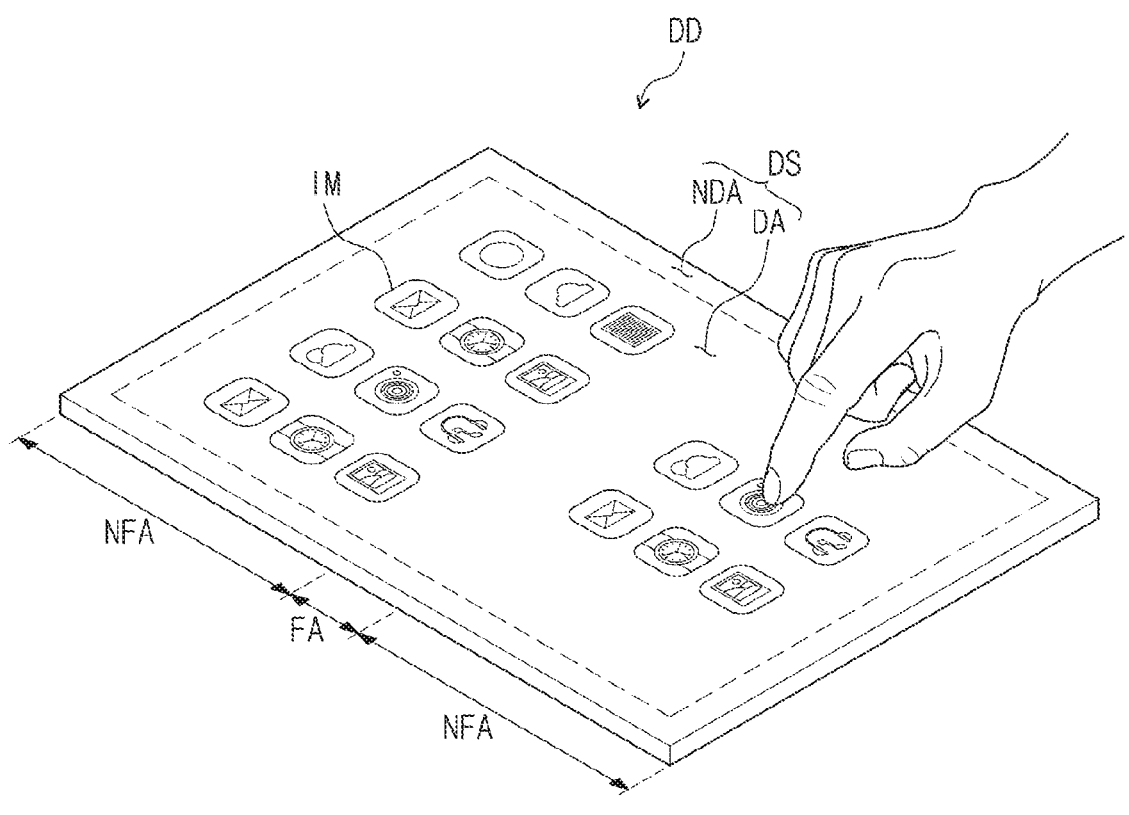
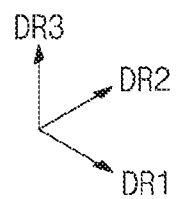

DISPLAY DEVICE

CROSS-REFERENCE TO RELATED APPLICATION

This application claims priority from and the benefit of Korean Patent Application No. 10-2019-0021976, filed on Feb. 25, 2019, which is hereby incorporated by reference for all purposes as if fully set forth herein.

BACKGROUND

Field

Exemplary embodiments of the invention relate generally to a display device, and more specifically, to a display device configured to prevent a display module from being damaged.

Discussion of the Background

In general, electronic products, such as a smart phone, a digital camera, a notebook computer, a navigation system, and a smart television, have a display device for displaying an image to a user. The display device generates an image and provides the image to a user through a screen.

With the development of display technologies, various display devices have recently been developed. A typical example of such a display device is a flexible display device that can be curvedly deformed, folded, or rolled. The use of the flexible display device allows for improvement in portability and user convenience.

The display device includes a display module displaying an image, a supporting portion disposed under the display module to support the display module, and a case containing the display module and the supporting portion. The supporting portion is attached to a bottom surface of the display module and then the display module and the supporting portion are contained in the case. When the display module and the supporting portion are inserted in the case, an edge of the display module may be in contact with the case, and in this instance, the display module may be damaged.

The above information disclosed in this Background section is only for understanding of the background of the inventive concepts, and, therefore, it may contain information that does not constitute prior art.

SUMMARY

Exemplary embodiments of the invention provide a display device which prevents a display module from being damaged.

Additional features of the inventive concepts will be set forth in the description which follows, and in part will be apparent from the description, or may be learned by practice of the inventive concepts.

An exemplary embodiment of the invention provides a display device including a display module, a supporting portion disposed below the display module, a plurality of protruding portions protruding from an edge of the supporting portion. The case contains the display module, the supporting portion, and the protruding portions. The case includes a bottom portion disposed below the supporting portion and a sidewall portion spaced apart from an edge of the display module and extended along the edge of the display module. The protruding portions protrude outward relative to the edge of the display module and are adjacent to the sidewall portion.

Another exemplary embodiment of the invention provides a display device including a display module including a first non-folding region, a second non-folding region, and a folding region disposed between the first and second non-folding regions, a first supporting portion disposed below the first non-folding region, a second supporting portion disposed below the second non-folding region, and a case disposed below the first and second supporting portions. The case includes a bottom portion disposed below the first and second supporting portions and a sidewall portion spaced apart from an edge of the display module and extended along the edge of the display module. A first side of the first supporting portion faces a first side of the second supporting portion. At least one side of other sides of the first supporting portion, except the first side of the first supporting portion, and at least one side of other sides of the second supporting portion, except the first side of the second supporting portion, extend outward relative to the edge of the display module. The at least one side of the first supporting portion and the at least one side of the second supporting portion are adjacent to the sidewall portion.

Another exemplary embodiment of the invention provides a display device including a display module, a supporting portion disposed below the display module, a plurality of protruding portions protruding from an edge of the supporting portion, and a case disposed below the supporting portion to contain the display module, the supporting portion, and the protruding portions. The protruding portions extend outward relative to an edge of the display module and are connected to the case.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate exemplary embodiments of the invention, and together with the description serve to explain the inventive concepts.

FIG. 1 is a perspective view illustrating a display device according to an exemplary embodiment of the invention.

DETAILED DESCRIPTION

Figure 2:
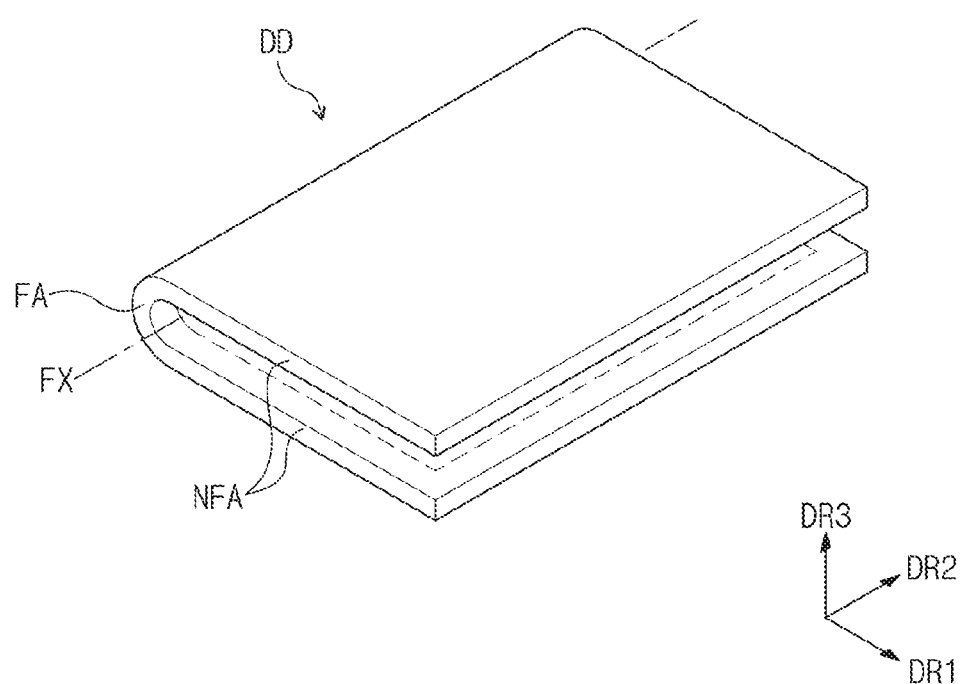
FIG. 2 is a perspective view illustrating a folded structure of the display device of FIG. 1.

In the following description, for the purposes of explanation, numerous specific details are set forth in order to provide a thorough understanding of various exemplary embodiments of the invention. As used herein "embodiments" are non-limiting examples of devices or methods employing one or more of the inventive concepts disclosed herein. It is apparent, however, that various exemplary embodiments may be practiced without these specific details or with one or more equivalent arrangements. In other instances, well-known structures and devices are shown in block diagram form in order to avoid unnecessarily obscuring various exemplary embodiments. Further, various exemplary embodiments may be different, but do not have to be exclusive. For example, specific shapes, configurations, and characteristics of an exemplary embodiment may be used or implemented in another exemplary embodiment without departing from the inventive concepts.

Unless otherwise specified, the illustrated exemplary embodiments are to be understood as providing exemplary features of varying detail of some ways in which the inventive concepts may be implemented in practice. Therefore, unless otherwise specified, the features, components, modules, layers, films, panels, regions, and/or aspects, etc. (hereinafter individually or collectively referred to as "elements"), of the various embodiments may be otherwise combined, separated, interchanged, and/or rearranged without departing from the inventive concepts.

The use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, etc., of the elements, unless specified. Further, in the accompanying drawings, the size and relative sizes of elements may be exaggerated for clarity and/or descriptive purposes. When an exemplary embodiment may be implemented differently, a specific process order may be performed differently from the described order. For example, two consecutively described processes may be performed substantially at the same time or performed in an order opposite to the described order. Also, like reference numerals denote like elements.

When an element, such as a layer, is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. To this end, the term "connected" may refer to physical, electrical, and/or fluid connection, with or without intervening elements. Further, the D1-axis, the D2-axis, and the D3-axis are not limited to three axes of a rectangular coordinate system, such as the x, y, and z-axes, and may be interpreted in a broader sense. For example, the D1-axis, the D2-axis, and the D3-axis may be perpendicular to one another, or may represent different directions that are not perpendicular to one another. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. As used herein, the term "and/or" includes any and all combinations of one or more of the associated listed items.

Although the terms "first," "second," etc. may be used herein to describe various types of elements, these elements should not be limited by these terms. These terms are used to distinguish one element from another element. Thus, a first element discussed below could be termed a second element without departing from the teachings of the disclosure.

Spatially relative terms, such as "beneath," "below," "under," "lower," "above," "upper," "over," "higher," "side" (e.g., as in "sidewall"), and the like, may be used herein for descriptive purposes, and, thereby, to describe one elements relationship to another element(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the exemplary term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof. It is also noted that, as used herein, the terms "substantially," "about," and other similar terms, are used as terms of approximation and not as terms of degree, and, as such, are utilized to account for inherent deviations in measured, calculated, and/or provided values that would be recognized by one of ordinary skill in the art.

Various exemplary embodiments are described herein with reference to sectional and/or exploded illustrations that are schematic illustrations of idealized exemplary embodiments and/or intermediate structures. As such, variations from the shapes of the illustrations as a result, for example, of manufacturing techniques and/or tolerances, are to be expected. Thus, exemplary embodiments disclosed herein should not necessarily be construed as limited to the particular illustrated shapes of regions, but are to include deviations in shapes that result from, for instance, manufacturing. In this manner, regions illustrated in the drawings may be schematic in nature and the shapes of these regions may not reflect actual shapes of regions of a device and, as such, are not necessarily intended to be limiting.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and should not be interpreted in an idealized or overly formal sense, unless expressly so defined herein.

FIG. 1 is a perspective view illustrating a display device according to an exemplary embodiment of the invention. FIG. 2 is a perspective view illustrating a folded structure of the display device of FIG. 1.

Referring to FIG. 1, a display device DD may have a rectangular or tetragonal shape, whose long sides are parallel to a first direction DR1 and whose short sides are parallel to a second direction DR2 crossing the first direction DR1. However, the inventive concept is not limited to this example, and in an exemplary embodiment, the display device DD may have various shapes such as circular and polygonal shapes. The display device DD may be a flexible display device.

Hereinafter, a direction perpendicular to both of the first and second directions DR1 and DR2 will be referred to as a third direction DR3. Furthermore, in the present specification, the expression "when viewed in a plan view" may mean that a relevant structure is seen in the third direction DR3.

The display device DD may include a folding region FA and a plurality of non-folding regions NFA. The folding region FA may be disposed between the non-folding regions NFA, and the folding region FA and the non-folding regions NFA may be arranged in the first direction DR1.

The display device DD is illustrated to have one folding region FA and two non-folding regions NFA, but the numbers of the folding region FA and the non-folding regions NFA are not limited to this example. For example, the display device DD may include three or more non-folding regions NFA and a plurality of folding regions FA disposed between the non-folding regions NFA.

A top surface of the display device DD may be defined as a display surface DS and may be parallel to both of the first direction DR1 and the second direction DR2. Images IM generated by the display device DD may be provided to a user through the display surface DS.

The display surface DS may include a display region DA and a non-display region NDA near the display region DA. The display region DA may be used to display an image, while the non-display region NDA may not be used to display an image. The non-display region NDA may be disposed to enclose the display region DA and to define an edge of the display device DD, which is printed with a specific color.

Referring to FIG. 2, the display device DD may be a foldable display device, which can be folded or unfolded. For example, the folding region FA may be bent along a folding axis FX parallel to the second direction DR2, when the display device DD is folded. The folding axis FX may be defined as a short axis that is parallel to the short side of the display device DD.

When the display device DD is folded, the non-folding regions NFA may face each other, and the display device DD may be folded in an in-folding manner that the display surface DS is not exposed to the outside.

Figure 3:
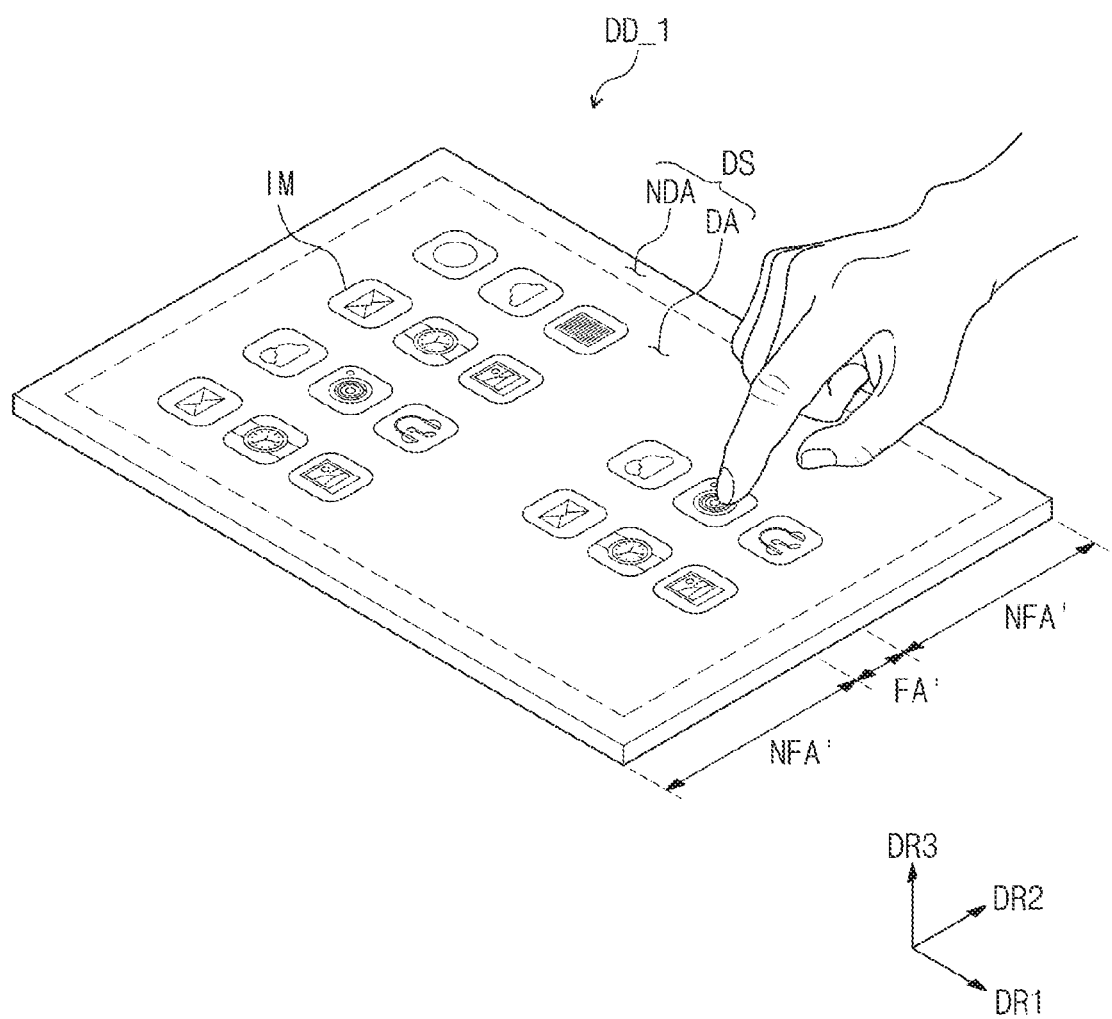
FIG. 3 is a perspective view illustrating a display device according to an exemplary embodiment of the invention.
Figure 4:
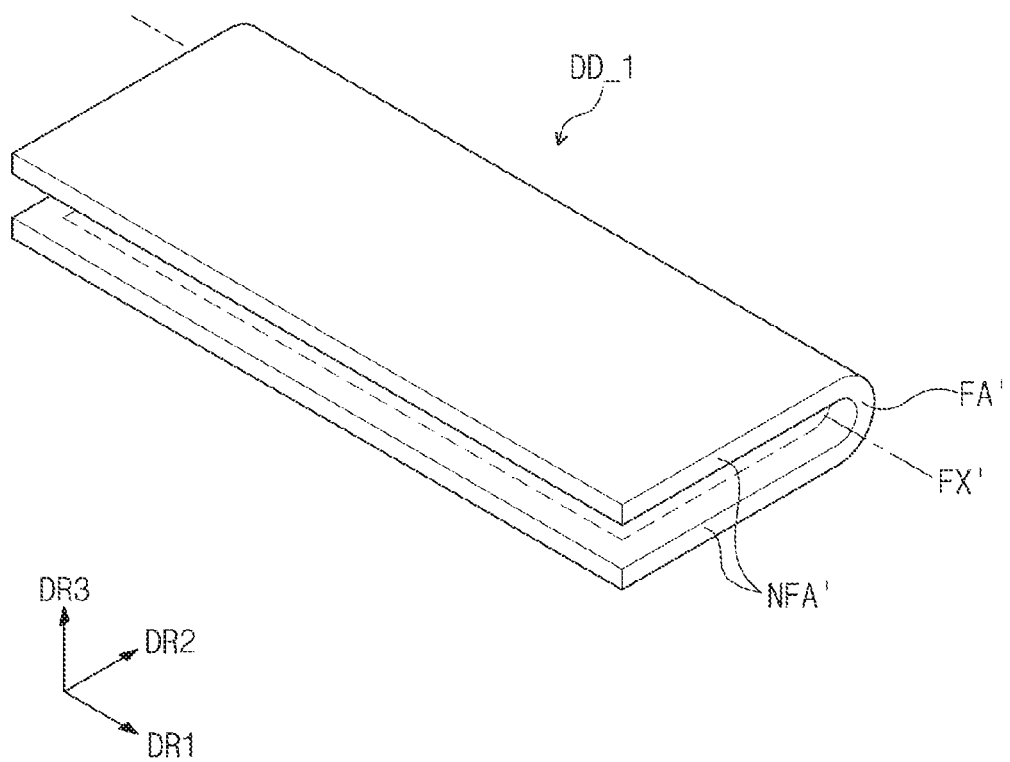
FIG. 4 is a perspective view illustrating a folded structure of the display device of FIG. 3.

FIG. 3 is a perspective view illustrating a display device according to an exemplary embodiment of the invention. FIG. 4 is a perspective view illustrating a folded structure of the display device of FIG. 3.

Except for a difference in a folding manner, a display device DD_1 of FIG. 3 may have substantially the same features as the display device DD of FIG. 1. Thus, the folding operation of the display device DD_1 will be mainly described below.

Referring to FIGS. 3 and 4, the display device DD_1 may include a folding region FA' and a plurality of non-folding regions NFA'. The folding region FA' may be disposed between the non-folding regions NFA', and the folding region FA' and the non-folding regions NFA' may be arranged in the second direction DR2.

The folding region FA' may be bent along the folding axis FX' parallel to the first direction DR1, when the display device DD_1 is folded. The folding axis FX' may be defined as a long axis that is parallel to the long side of the display device DD_1. The display device DD of FIG. 1 may be folded along the short axis, while the display device DD_1 of FIG. 3 may be folded along the long axis. The display device DD_1 may be folded in an in-folding manner such that the display surface DS is not exposed to the outside.

Hereinafter, structures of the display device DD, which is folded along the short axis, will be described, but the inventive concept is not limited to this example. That is, various structures to be described below can be modified to realize the display device DD_1 folded along the long axis, without departing from the inventive concept.

Figure 5:
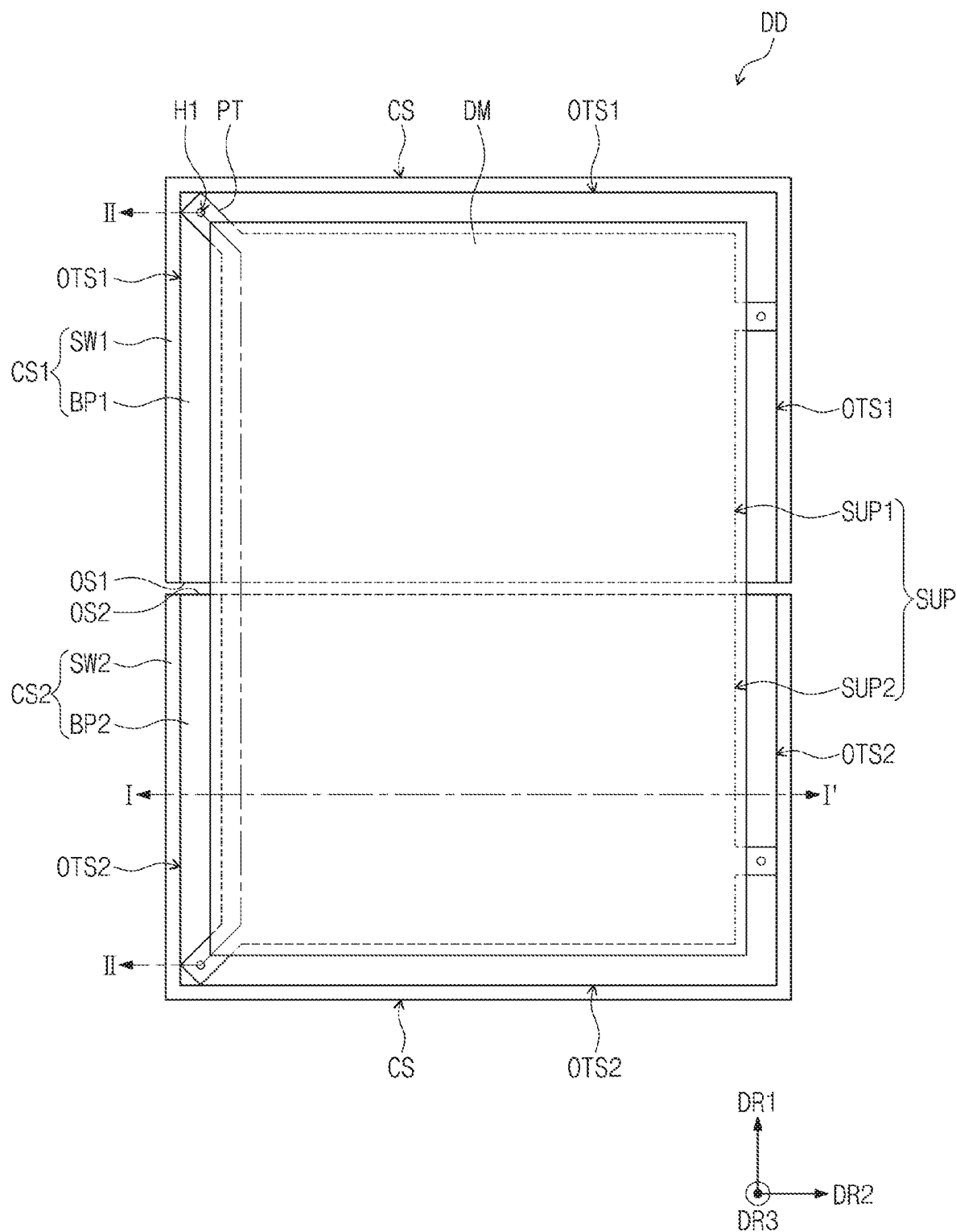
FIG. 5 is a diagram illustrating a planar structure of the display device of FIG. 1.

FIG. 5 is a diagram illustrating a planar structure of the display device of FIG. 1.

Referring to FIG. 5, the display device DD according to an exemplary embodiment of the invention may include a display module DM, a supporting portion SUP, a plurality of protruding portions PT, and a case CS. The supporting portion SUP and the case CS may be disposed below the display module DM, and the supporting portion SUP may be disposed between the display module DM and the case CS. A stacking structure of the display module DM, the supporting portion SUP, and the case CS will be described in more detail below.

For convenience in description and illustration, in FIG. 5, the supporting portion SUP and a portion of the case CS, which are veiled by the display module DM, are depicted by dotted lines.

When viewed in a plan view, an area of the supporting portion SUP may be smaller than an area of the display module DM. When viewed in a plan view, an edge of the supporting portion SUP may be disposed inside an edge of the display module DM. The supporting portion SUP may have a rectangular or tetragonal shape. The supporting portion SUP may be formed of, or include, a metallic material (e.g., an alloy of aluminum and magnesium).

The protruding portions PT may protrude from the edge of the supporting portion SUP. The protruding portions PT may protrude outward from the edge of the display module DM. The protruding portions PT may have a rectangular or tetragonal shape. However, the inventive concept is not limited to this example, and in an exemplary embodiment, the protruding portions PT may have various shapes, such as circular and polygonal shapes.

The protruding portions PT may protrude from at least one vertex of the supporting portion SUP and at least one side of the supporting portion SUP. For example, four protruding portions PT may protrude from the supporting portion SUP, but the number of the protruding portions PT is not limited thereto. Positions and disposition of the protruding portions PT will be described in more detail below.

The supporting portion SUP may include a first supporting portion SUP1 and a second supporting portion SUP2, which are arranged in the first direction DR1. The first supporting portion SUP1 and the second supporting portion SUP2 may have a surface that is defined by or parallel to the first and second directions DR1 and DR2. The first supporting portion SUP1 and the second supporting portion SUP2 may have a rectangular or tetragonal shape.

The case CS may include a first case CS1 and a second case CS2, which are arranged in the first direction DR1. The first case CS1 may be overlapped with the first supporting portion SUP1, and the second case CS2 may be overlapped with the second supporting portion SUP2.

The first case CS1 may include a first bottom portion BP1, which has a rectangular or tetragonal shape, and a first sidewall portion SW1, which is extended from other sides OTS1 of the first bottom portion BP1, except one side OS1 of the first bottom portion BP1. The second case CS2 may include a second bottom portion BP2, which has a rectangular or tetragonal shape, and a second sidewall portion SW2, which is extended from other sides OTS2 of the second bottom portion BP2, except one side OS2 of the second bottom portion BP2.

The one side OS1 of the first bottom portion BP1 may face the one side OS2 of the second bottom portion BP2. The first and second sidewall portions SW1 and SW2 may be extended in substantially the third direction DR3, and this structure will be described with reference to FIGS. 7 and 8.

When viewed in a plan view, the first bottom portion BP1 may have an area larger than the first supporting portion SUP1, and the second bottom portion BP2 may have an area larger than the second supporting portion SUP2. The first and second sidewall portions SW1 and SW2 may be spaced apart from the edge of the display module DM and may be extended along the edge of the display module DM.

The case CS may include a bottom portion and a sidewall portion extended from an edge of the bottom portion. For example, the first and second bottom portions BP1 and BP2 may define the bottom portion of the case CS, and the first and second sidewall portions SW1 and SW2 may define the sidewall portion of the case CS. The other sides OTS1 and OTS2 of the first and second bottom portions BP1 and BP2 may define the edge of the bottom portion.

The protruding portions PT may be adjacent to the first and second sidewall portions SW1 and SW2. In detail, the protruding portions PT may be in contact with the first and second sidewall portions SW1 and SW2. A first hole H1 may be defined in each of the protruding portions PT. The function of the first hole H1 will be described in more detail below.

Figure 6:
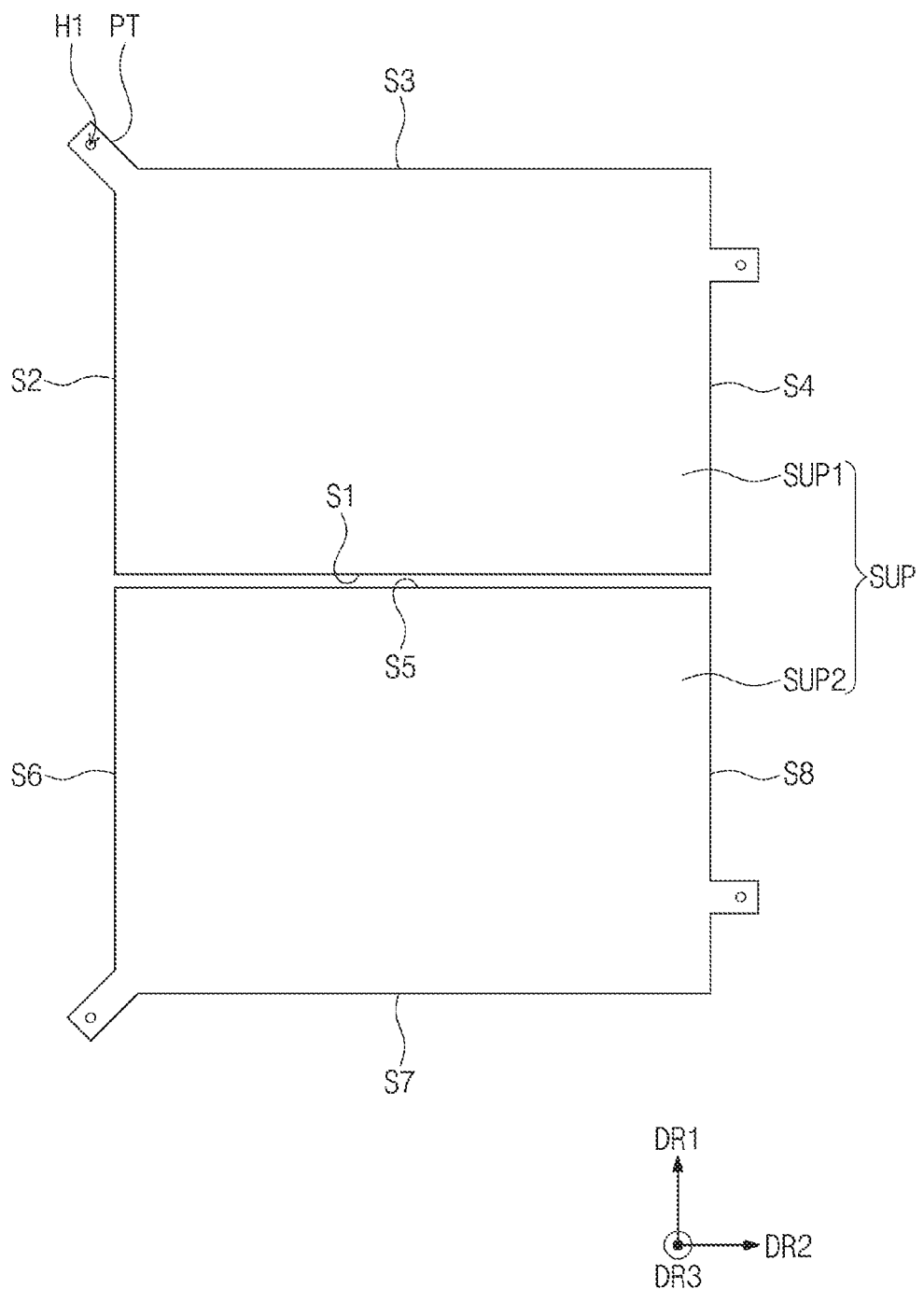
FIG. 6 is a plan view of a supporting portion of FIG. 5.

FIG. 6 is a plan view of a supporting portion of FIG. 5.

Referring to FIG. 6, the first supporting portion SUP1 may include first to fourth sides S1-S4, which are connected to each other to form a rectangular or tetragonal shape. The second supporting portion SUP2 may include fifth to eighth sides S5-S8, which are connected to each other to form a rectangular or tetragonal shape. The first to fourth sides S1-S4 may be sequentially disposed in a clockwise direction, and the fifth to eighth sides S5-S8 may be sequentially disposed in a counterclockwise direction.

The first side S1 may face the fifth side S5. The first and third sides S1 and S3 may be opposite to each other and may be extended in the second direction DR2. The second and fourth sides S2 and S4 may be opposite to each other and may be extended in the first direction DR1. The fifth and seventh sides S5 and S7 may be opposite to each other and may be extended in the second direction DR2. The sixth and eighth sides S6 and S8 may be opposite to each other and may be extended in the first direction DR1. The afore-described edge of the supporting portion SUP may be defined by the second, third, fourth, sixth, seventh, and eighth sides S2, S3, S4, S6, S7, and S8.

The protruding portions PT may protrude from one of vertices defined by the second to fourth sides S2-S4, one of the second to fourth sides S2-S4, one of vertices defined by the sixth to eighth sides S6-S8, and one of the sixth to eighth sides S6-S8. For example, the protruding portions PT may protrude from the vertex defined by the second side S2 and the third side S3, the fourth side S4, the vertex defined by the sixth side S6 and the seventh side S7, and the eighth side S8.

Figure 7:
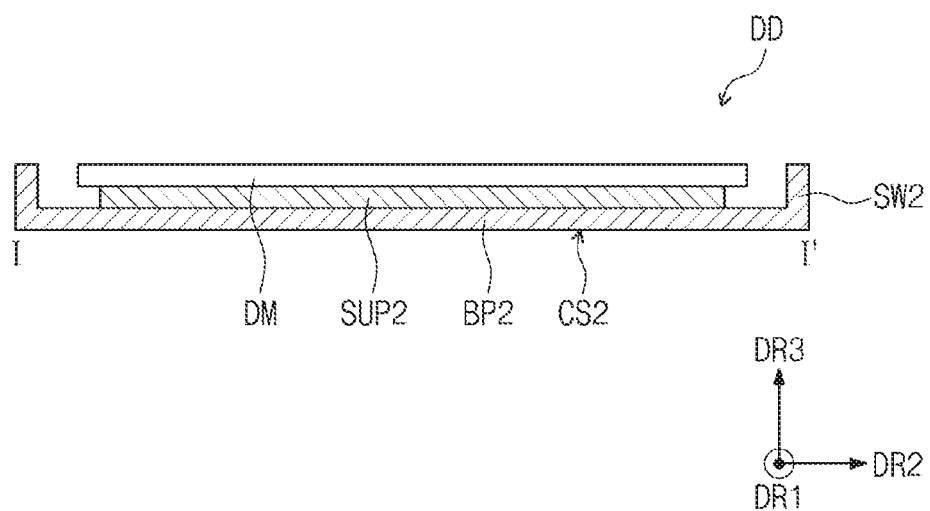
FIG. 7 is a sectional view taken along a line I-I' of FIG. 5.
Figure 8:
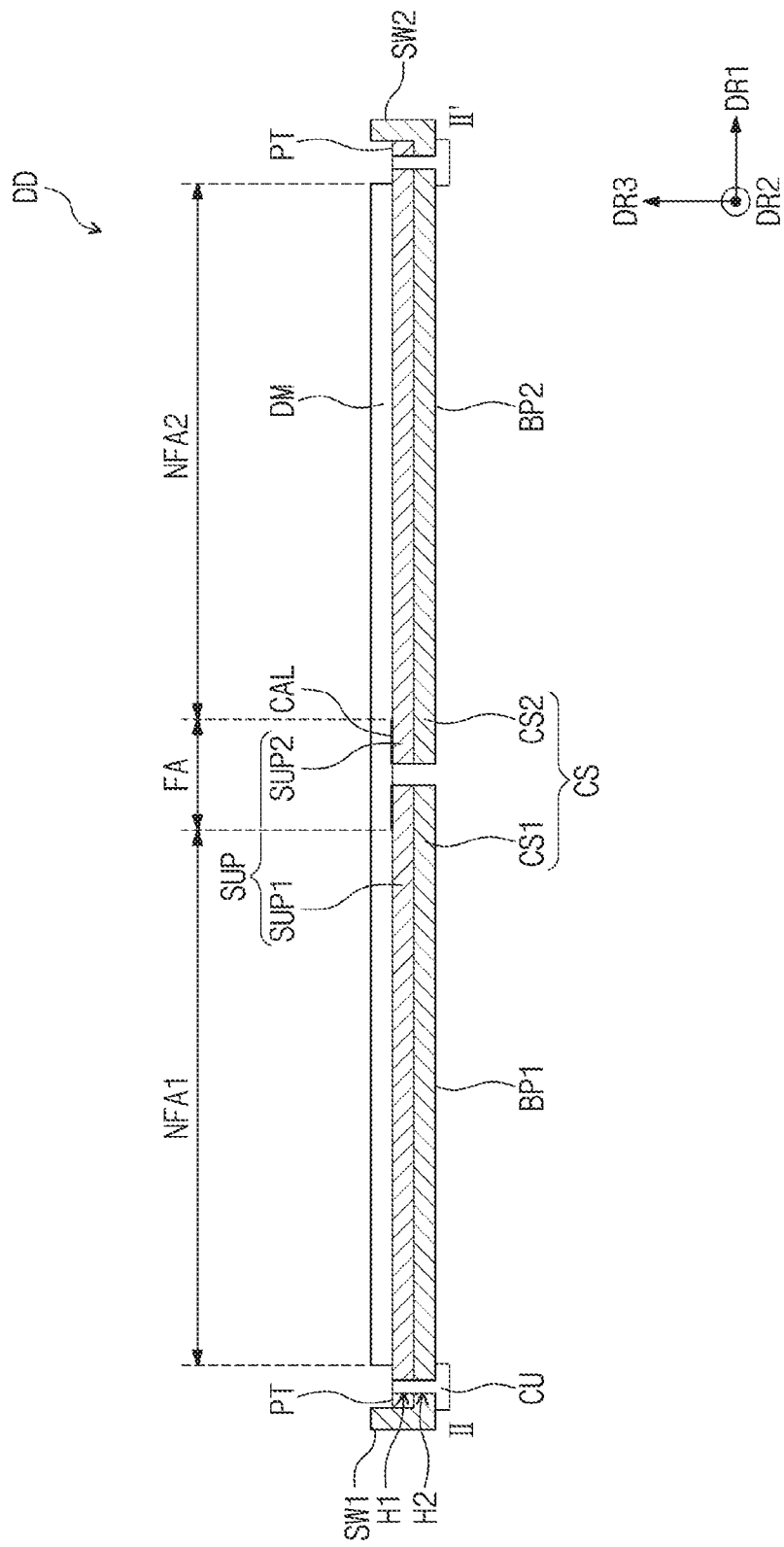
FIG. 8 is a sectional view taken along a line II-II' of FIG. 5.

FIG. 7 is a sectional view taken along a line I-I' of FIG. 5. FIG. 8 is a sectional view taken along a line II-II' of FIG. 5.

Referring to FIGS. 7 and 8, the supporting portion SUP may be disposed below the display module DM, and the case CS may be disposed below the supporting portion SUP. The display module DM, the supporting portion SUP, and the protruding portions PT may be contained in the case CS.

The display module DM may include a first non-folding region NFA1, a second non-folding region NFA2, and the folding region FA between the first non-folding region NFA1 and the second non-folding region NFA2. When the display device DD is folded, the first and second non-folding regions NFA1 and NFA2 may be maintained in a flat state and the folding region FA may be bent.

The first supporting portion SUP1 may be disposed below the first non-folding region NFA1, and the second supporting portion SUP2 may be disposed below the second non-folding region NFA2. Although not shown, an adhesive agent may be disposed between the first and second supporting portions SUP1 and SUP2 and the first and second non-folding regions NFA1 and NFA2. The adhesive agent may attach the first and second supporting portions SUP1 and SUP2 to the first and second non-folding regions NFA1 and NFA2, respectively. The adhesive agent may include a pressure sensitive adhesive.

A coating layer CAL may be disposed between the folding region FA and the first supporting portion SUP1 between and the folding region FA and the second supporting portion SUP2. The coating layer CAL may not be overlapped with the first and second non-folding regions NFA1 and NFA2. The coating layer CAL may prevent the folding region FA from being attached to the first and second supporting portions SUP1 and SUP2 by the adhesive agent. For example, the coating layer CAL may be formed of or include a fluorine-containing material.

The first case CS1 may be disposed below the first supporting portion SUP1, and the second case CS2 may be disposed below the second supporting portion SUP2. In detail, the first bottom portion BP1 may be disposed below the first supporting portion SUP1, and the first sidewall portion SW1 may be extended from the first bottom portion BP1 in an upward direction. The upward direction may mean the third direction DR3. The second bottom portion BP2 may be disposed below the second supporting portion SUP2, and the second sidewall portion SW2 may be extended from the second bottom portion BP2 in the upward direction.

The first bottom portion BP1 may have an area larger than the first supporting portion SUP1, and the second bottom portion BP2 may have an area larger than the second supporting portion SUP2. The first and second sidewall portions SW1 and SW2 may be spaced apart from the edge of the display module DM.

The protruding portions PT may be connected to the first and second bottom portions BP1 and BP2. For example, a plurality of second holes H2 may be defined in the first and second bottom portions BP1 and BP2 to be overlapped with the first holes H1, and a plurality of coupling units CU may be inserted in the first holes H1 and the second holes H2.

The coupling units CU may be inserted toward the protruding portions PT through bottoms of the first and second bottom portions BP1 and BP2. The coupling units CU may be screws, and the protruding portions PT may be connected to the first and second bottom portions BP1 and BP2 by the coupling units CU.

Figure 9:
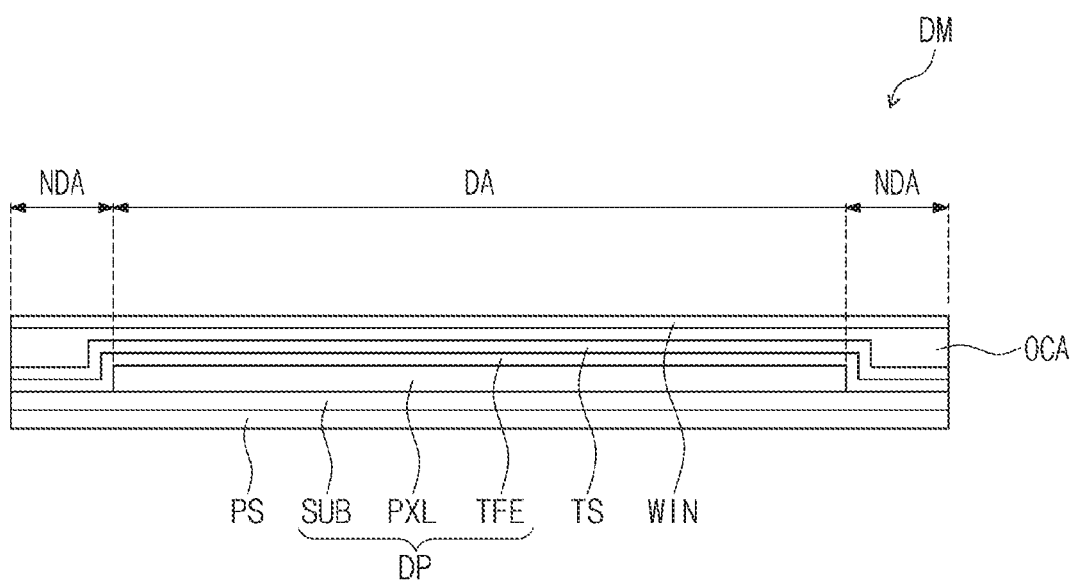
FIG. 9 is a sectional view schematically illustrating a display module of FIGS. 7 and 8.

FIG. 9 is a sectional view schematically illustrating a display module of FIGS. 7 and 8.

Referring to FIG. 9, the display module DM may include a display panel DP, a touch sensing portion TS disposed on the display panel DP, a window WIN disposed on the touch sensing portion TS, an adhesive agent OCA disposed between the touch sensing portion TS and the window WIN, and a protection substrate PS disposed below the display panel DP.

The display panel DP may be an organic light emitting display panel. However, the inventive concept is not limited to this example, and various image display panels, such as a liquid crystal display panel, an electrowetting display panel, and an electrophoretic display panel, may be used as the display panel DP.

The display panel DP may include a substrate SUB, a pixel layer PXL disposed on the substrate SUB, and a thin encapsulation layer TFE disposed on the substrate SUB to cover the pixel layer PXL. The substrate SUB may be a transparent substrate and may include a flexible plastic substrate. For example, the substrate SUB may include polyimide (PI).

The substrate SUB may include the display region DA and the non-display region NDA near the display region DA, similar to the display device DD. The pixel layer PXL may be disposed on the display region DA. The pixel layer PXL may include a plurality of pixels, each of which includes a light-emitting device.

The thin encapsulation layer TFE may include at least two inorganic layers and an organic layer disposed between the inorganic layers. The inorganic layers may include an inorganic material and may protect the pixel layer PXL from moisture or oxygen. The organic layer may include an organic material and may protect the pixel layer PXL from a contamination material such as dust particles.

The touch sensing portion TS may sense an external input (e.g., a user's hand, a touch pen, and so forth), may generate an input signal from the sensed external input, and may provide the input signal to the display panel DP. The touch sensing portion TS may include a plurality of sensing electrodes (e.g., see FIG. 14) for sensing the external input. The sensing electrodes may sense an external input in a capacitive manner. The display panel DP may receive an input signal from the touch sensing portion TS and may produce an image corresponding to the input signal.

The window WIN may protect the display panel DP and the touch sensing portion TS from an external scratch and an external impact. The window WIN may be attached to the touch sensing portion TS by the adhesive agent OCA. The adhesive agent OCA may include an optical clear adhesive. An image produced by the display panel DP may be provided to a user through the window WIN.

The protection substrate PS may protect a bottom portion of the display panel DP. The protection substrate PS may include a flexible plastic substrate. For example, the protection substrate PS may include polyethylene terephthalate (PET). Although not shown, a cushion layer may be disposed below the protection substrate PS to absorb an external impact to be exerted on a bottom portion of the display module DM.

Figure 10:
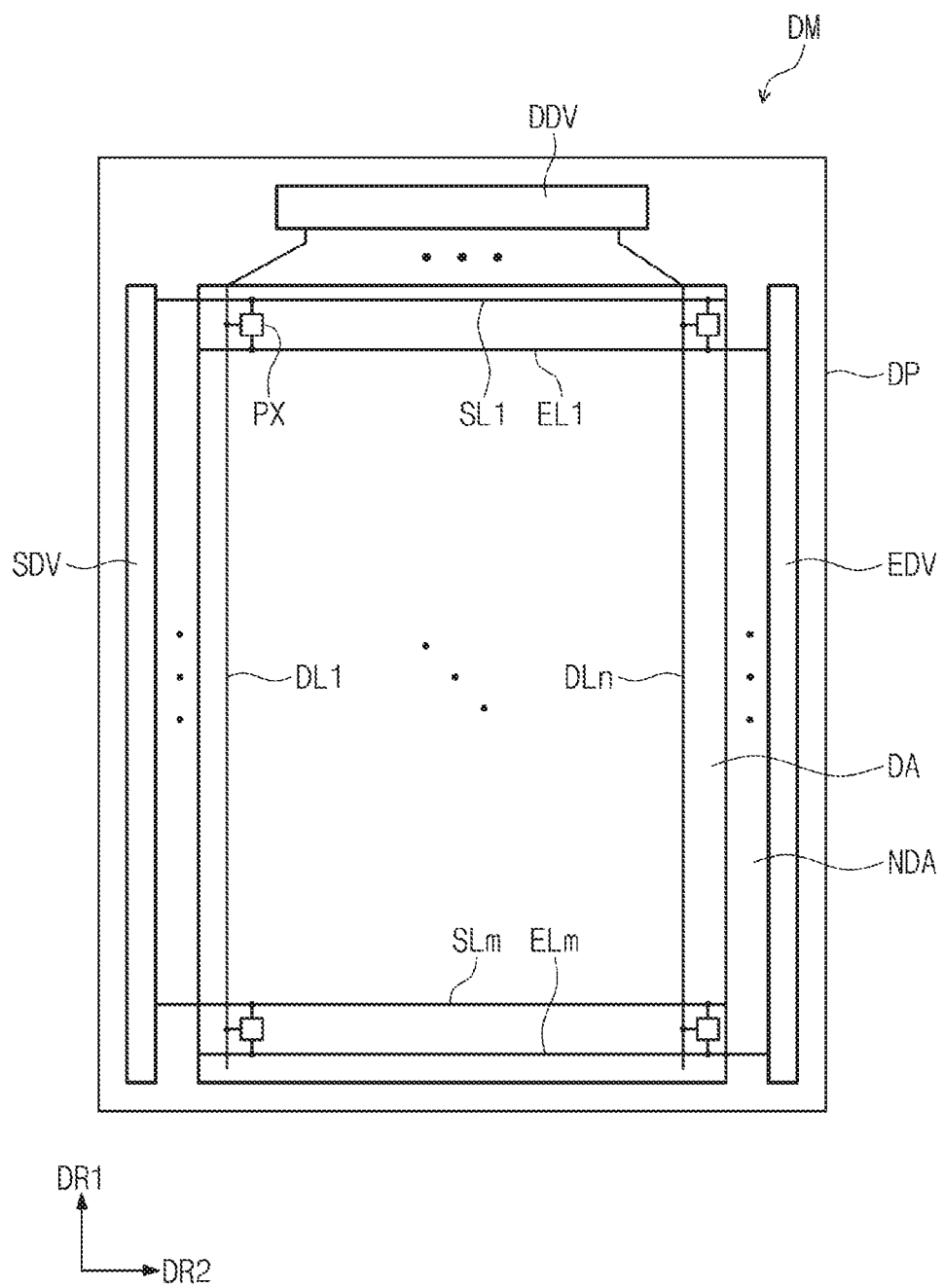
FIG. 10 is a plan view illustrating the display module of FIG. 9.

FIG. 10 is a plan view illustrating the display module of FIG. 9.

Referring to FIG. 10, the display module DM according to an exemplary embodiment of the invention may include the display panel DP, a scan driver SDV, a data driver DDV, and an emission driver EDV.

The display panel DP may be a flexible display panel. For example, the display panel DP may include a plurality of electronic devices disposed on a flexible substrate. The display panel DP may have a rectangular shape, whose long sides are parallel to the first direction DR1 and whose short sides are parallel to the second direction DR2.

The display panel DP may have a flat surface, which is defined by or parallel to the first and second directions DR1 and DR2. The display panel DP may include the display region DA and the non-display region NDA surrounding the display region DA, similar to the display surface DS of the display device DD.

The display panel DP may include a plurality of pixels PX, a plurality of scan lines SL1-SLm, a plurality of data lines DL1-DLn, and a plurality of emission lines EL1-ELm, where m and n are natural numbers. The pixels PX may be arranged in a matrix shape, but the arrangement of the pixels PX may not be limited to this example and may be variously changed. The pixels PX may be disposed in the display region DA and may be connected to the scan lines SL1-SLm, the data lines DL1-DLn, and the emission lines EL1-ELm.

The scan driver SDV, the data driver DDV, and the emission driver EDV may be disposed in the non-display region NDA. For example, the scan driver SDV may be disposed in a portion of the non-display region NDA, which is adjacent to a side of the display panel DP defined as one of the long sides of the display panel DP.

The emission driver EDV may be disposed in another portion of the non-display region NDA adjacent to an opposite side of the display panel DP, and here, the opposite side of the display panel DP may be defined as a side that is opposite to the side of the display panel DP. The data driver DDV may be manufactured in the form of an integrated circuit chip and may be disposed in a portion of the non-display region NDA, which is adjacent to one of the short sides of the display panel DP.

The scan lines SL1-SLm may be extended in the second direction DR2 and may be connected to the scan driver SDV. The data lines DL1-DLn may be extended in the first direction DR1 and may be connected to the data driver DDV. The emission lines EL1-Elm may be extended in the second direction DR2 and may be connected to the emission driver EDV.

The scan driver SDV may produce a plurality of scan signals, and the scan signals may be applied to the pixels PX through the scan lines SL1-SLm. The scan signals may be sequentially applied to the pixels PX. The data driver DDV may produce a plurality of data voltages, and the data voltages may be applied to the pixels PX through the data lines DL1-DLn. The emission driver EDV may produce a plurality of emission signals, and the emission signals may be applied to the pixels PX through the emission lines EL1-Elm.

Although not shown, the display module DM may include a timing controller (not shown) for controlling operations of the scan driver SDV, the data driver DDV, and the emission driver EDV.

The timing controller may generate scan control signals, data control signals, and emission control signals in response to control signals to be transmitted from the outside. The timing controller may receive image signals from the outside, may convert the image signals to a data format, which is suitable for interface specifications required by the data driver DDV, and may provide the converted data to the data driver DDV.

The scan driver SDV may produce scan signals in response to the scan control signal, and the emission driver EDV may produce emission signals in response to the emission control signal. The data driver DDV may receive the image signals of the converted data format and then may generate data voltages corresponding to the image signals, in response to the data control signal.

The pixels PX may receive the data voltages in response to the scan signals. The pixels PX may emit light, which has a brightness level corresponding to the data voltage and constitutes an image, in response to the emission signals. A light-emitting time duration of the pixel PX may be controlled by the emission signals.

Figure 11:
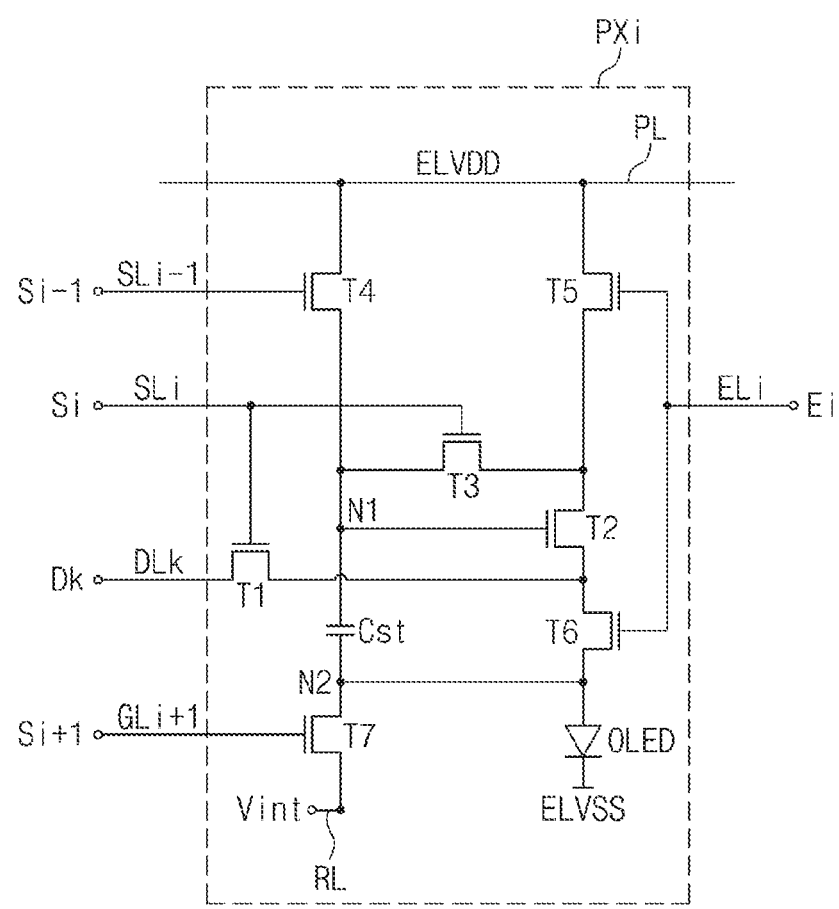
FIG. 11 is an equivalent circuit diagram exemplarily illustrating each of pixels shown in FIG. 10.
Figure 12:
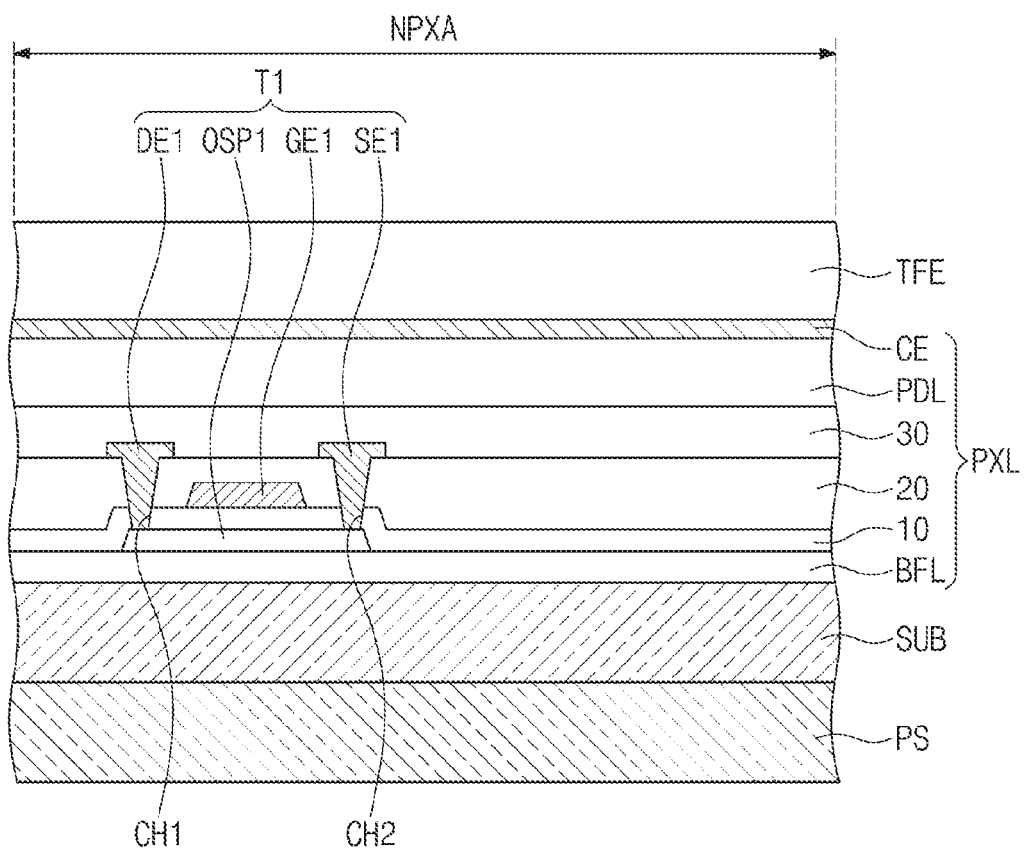
FIGS. 12 and 13 are sectional views exemplarily illustrating the pixel of FIG. 11.
Figure 13:
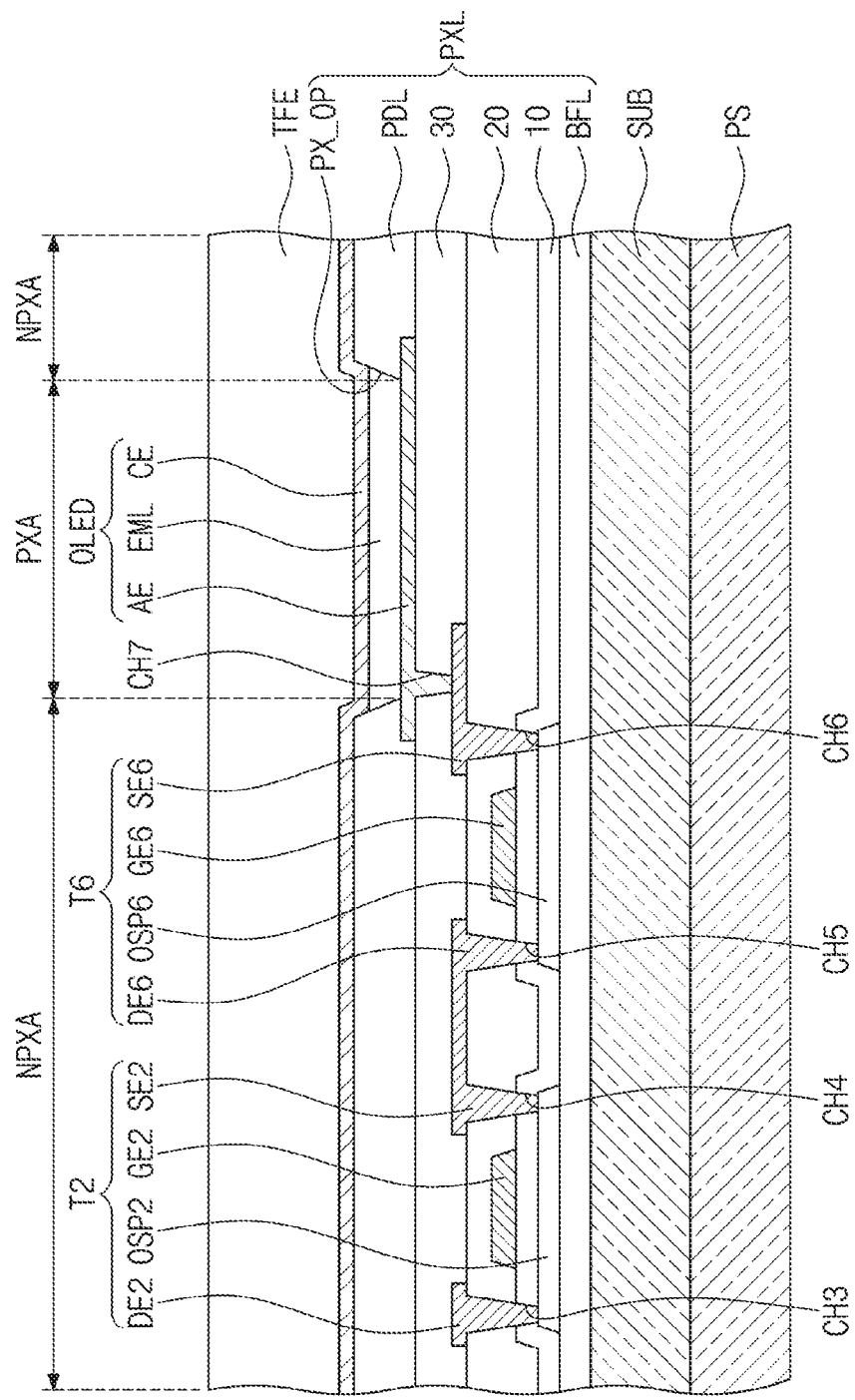

FIG. 11 is an equivalent circuit diagram exemplarily illustrating each of pixels shown in FIG. 10. FIGS. 12 and 13 are sectional views exemplarily illustrating the pixel of FIG. 11.

An i-th pixel PXi, which is connected to a k-th data line DLk, is exemplarily illustrated in FIG. 11. FIG. 12 illustrates a sectional structure of a portion corresponding to a first transistor T1 of the equivalent circuit of FIG. 11. FIG. 13 illustrates a sectional structure of a portion corresponding to a second transistor T2, a sixth transistor T6, and an organic light emitting diode OLED of the equivalent circuit of FIG. 11. The organic light emitting diode OLED may be defined as a light-emitting device.

Referring to FIG. 11, the i-th pixel PXi may include the organic light emitting diode OLED and a driving circuit controlling the organic light emitting diode OLED. The driving circuit may include seven transistors T1-T7 and one capacitor Cst. Hereinafter, the seven transistors T1-T7 will be described to be N-type thin film transistors. However, the inventive concept is not limited to this example, and in an exemplary embodiment, the seven transistors T1-T7 may be P-type thin film transistors.

A driving transistor may control a driving current to be supplied to the organic light emitting diode OLED. In an exemplary embodiment, the driving transistor may be the second transistor T2. An output electrode of the second transistor T2 may be electrically connected to the organic light emitting diode OLED. The output electrode of the second transistor T2 may be in direct contact with an anode of the organic light emitting diode OLED or may be connected to the anode via other transistor (e.g., the sixth transistor T6).

A control electrode of a control transistor may receive a control signal. The control signal applied to the i-th pixel PXi may include an (i−1)-th scan signal Si−1, an i-th scan signal Si, an (i+1)-th scan signal Si+1, a data voltage Dk, and an i-th emission signal Ei. In an exemplary embodiment, the control transistor may include the first transistor T1 and the third to seventh transistors T3-T7.

A node between an output electrode of the fourth transistor T4 and a control electrode of the second transistor T2 may be defined as a first node N1, and a node between the seventh transistor T7 and the capacitor Cst may be defined as a second node N2. A power line PL may receive a first voltage ELVDD and may provide the first voltage ELVDD to the pixels PX.

The second transistor T2 may include an input electrode receiving the first voltage ELVDD through the fifth transistor T5, a control electrode coupled to the first node N1, and an output electrode. The output electrode of the second transistor T2 may provide the first voltage ELVDD to the organic light emitting diode OLED through the sixth transistor T6. The input electrode of the second transistor T2 may be coupled to the first node N1 through the third transistor T3. The second transistor T2 may control the driving current, which is supplied to the organic light emitting diode OLED, based on an electric potential of the first node N1.

The first transistor T1 may include an input electrode coupled to the k-th data line DLk, a control electrode coupled to an i-th scan line SLi, and an output electrode coupled to the output electrode of the second transistor T2. The first transistor T1 may be turned on or off by the scan signal Si (hereinafter, i-th scan signal) applied to the i-th scan line SLi. The first transistor T1 may be referred to as a switching transistor.

The third transistor T3 may include an input electrode coupled to the input electrode of the second transistor T2, a control electrode coupled to the i-th scan line SLi, and an output electrode coupled to the first node N1. The third transistor T3 may be turned on or off in response to the i-th scan signal Si.

When the first transistor T1 and the third transistor T3 are turned on, the second transistor T2 may be connected in the form of a diode between the first transistor T1 and the third transistor T3. The first transistor T1 may be coupled to the first node N1 through the second transistor T2 and the third transistor T3. Thus, the data voltage Dk applied to the k-th data line DLk may be provided to the capacitor Cst.

The capacitor Cst may be disposed between and connected to the first node N1 and the anode of the organic light emitting diode OLED. The capacitor Cst may be charged to a voltage corresponding to a voltage applied to the first node N1.

The fourth transistor T4 may include an input electrode coupled to the power line PL, a control electrode receiving the (i−1)-th scan signal Si−1, and an output electrode coupled to the first node N1. A switching operation of the fourth transistor T4 may be controlled by the (i−1)-th scan signal Si−1. The control electrode of the fourth transistor T4 may be coupled to an (i−1)-th scan line SLi−1. A signal line, to which the (i−1)-th scan signal Si−1 is applied, may be changed to a dummy signal line or the like.

The fifth transistor T5 may include an input electrode coupled to the power line PL, a control electrode coupled to an i-th emission line ELi, and an output electrode coupled to the input electrode of the second transistor T2. A switching operation of the fifth transistor T5 may be controlled by the i-th emission signal Ei.

The sixth transistor T6 may include an input electrode coupled to the output electrode of the second transistor T2, a control electrode coupled to the i-th emission line ELi, and an output electrode coupled to the anode of the organic light emitting diode OLED. A switching operation of the sixth transistor T6 may be controlled by the i-th emission signal Ei, which is provided from the i-th emission line ELi.

Depending on operations of the fifth and sixth transistors T5 and T6, a current path may be formed or blocked between the power line PL and the organic light emitting diode ED. In certain exemplary embodiments, one of the fifth and sixth transistors T5 and T6 may be omitted.

The seventh transistor T7 may include an input electrode coupled to an initialization line RL, a control electrode receiving an (i+1)-th scan signal Si+1, and an output electrode coupled to the anode of the organic light emitting diode ED. The control electrode of the seventh transistor T7 may be coupled to an (i+1)-th scan line SLi+1. A signal line, to which the (i+1)-th scan signal Si+1 is applied, may be changed to a dummy signal line or the like.

If the fourth transistor T4 is turned on, the first node N1 may be reset by the first voltage ELVDD. If the seventh transistor T7 is turned on, the second node N2 may be initialized by an initialization voltage Vint. The anode of the organic light emitting diode OLED may be initialized by the initialization voltage Vint, when the seventh transistor T7 is turned on. A potential difference between the initialization voltage Vint and a second voltage ELVSS applied to a cathode of the organic light emitting diode OLED may be lower than a light-emitting threshold voltage of the organic light emitting diode OLED.

Referring to FIGS. 12 and 13, the first transistor T1, the second transistor T2, and the sixth transistor T6 may be disposed on the substrate SUB. In an exemplary embodiment, the transistors may have substantially the same structure, and thus, the structure of the first transistor T1 will be described, without describing the structures of the second and sixth transistors T2 and T6.

The first transistor T1 may include a first input electrode DE1, a first output electrode SE1, a first control electrode GE1, and a first oxide semiconductor pattern OSP1. A buffer layer BFL may be disposed on a top surface of the substrate SUB. The buffer layer BFL may be formed of or include an inorganic material. The first oxide semiconductor pattern OSP1 may be disposed on the buffer layer BFL. The first oxide semiconductor pattern OSP1 may include indium-tin oxide (ITO), indium-gallium-zinc oxide (IGZO), zinc oxide (ZnO), indium-zinc oxide (IZnO), or the like.

Although not shown, the first oxide semiconductor pattern OSP1 may include a first or input region, a second or output region, and a channel region between the first and second regions. The first region may be disposed on the left side of the second region.

A first insulating layer 10 may be disposed on the first oxide semiconductor pattern OSP1. The first control electrode GE1 may be disposed on the first insulating layer 10, and a second insulating layer 20 may be disposed on the first insulating layer 10 to cover the first control electrode GE1. The second insulating layer 20 may be provided to have a flat top surface. The first insulating layer 10 may be formed of or include an inorganic material. The second insulating layer 20 may be formed of or include an organic material and/or an inorganic material.

A first contact hole CH1 and a second contact hole CH2 may be defined in the first and second insulating layers 10 and 20 to expose the first region and the second region, respectively, of the first oxide semiconductor pattern OSP1. Each of the first contact hole CH1 and the second contact hole CH2 may penetrate the first insulating layer 10 and the second insulating layer 20.

The first input electrode DE1 and the first output electrode SE1 may be disposed on the second insulating layer 20. The first input electrode DE1 and the first output electrode SE1 may be coupled to the first and second regions, respectively, of the first oxide semiconductor pattern OSP1 through the first and second contact holes CH1 and CH2.

A third insulating layer 30 may be disposed on the second insulating layer 20 to cover the first input electrode DE1 and the first output electrode SE1. The third insulating layer 30 may be provided to have a flat top surface. The third insulating layer 30 may be formed of or include an organic material and/or an inorganic material.

FIG. 13 illustrates an example of the sixth transistor T6, which has substantially the same structure as the second transistor T2. A sixth input electrode DE6 of the sixth transistor T6 may be disposed on the second insulating layer 20 and may be connected to a second output electrode SE2 of the second transistor T2.

A pixel definition layer PDL and the organic light emitting diode OLED may be disposed on the third insulating layer 30. An anode AE may be disposed on the third insulating layer 30. The anode AE may be connected to a sixth output electrode SE6 of the sixth transistor T6 through a seventh contact hole CH7, which is formed to penetrate the third insulating layer 30. A pixel opening PX_OP may be defined in the pixel definition layer PDL. The pixel opening PX_OP may expose at least a portion of the anode AE.

The pixel PX may include an emission region PXA and a non-emission region NPXA adjacent to the emission region PXA. The non-emission region NPXA may be disposed to surround the emission region PXA. The emission region PXA may be defined to correspond to a region of the anode AE exposed by the pixel opening PX_OP.

An organic emission layer EML may be disposed in the pixel opening PX_OP and on the anode AE. The organic emission layer EML may generate one of red, green, and blue lights. However, the inventive concept is not limited to this example, and in an exemplary embodiment, the organic emission layer EML may generate a white light through a combination of organic materials capable of generating red, green, and blue lights.

A cathode CE may be disposed on the organic emission layer EML. The cathode CE may be disposed in common on the plurality of the pixels PX. The thin encapsulation layer TFE may be disposed on the cathode CE. Although not shown, a capping layer may be further disposed to cover the cathode CE. In this case, the thin encapsulation layer TFE may cover the capping layer. In an exemplary embodiment, the buffer layer BFL, the cathode CE, and layers therebetween may be defined as the pixel layer PXL.

Figure 14:
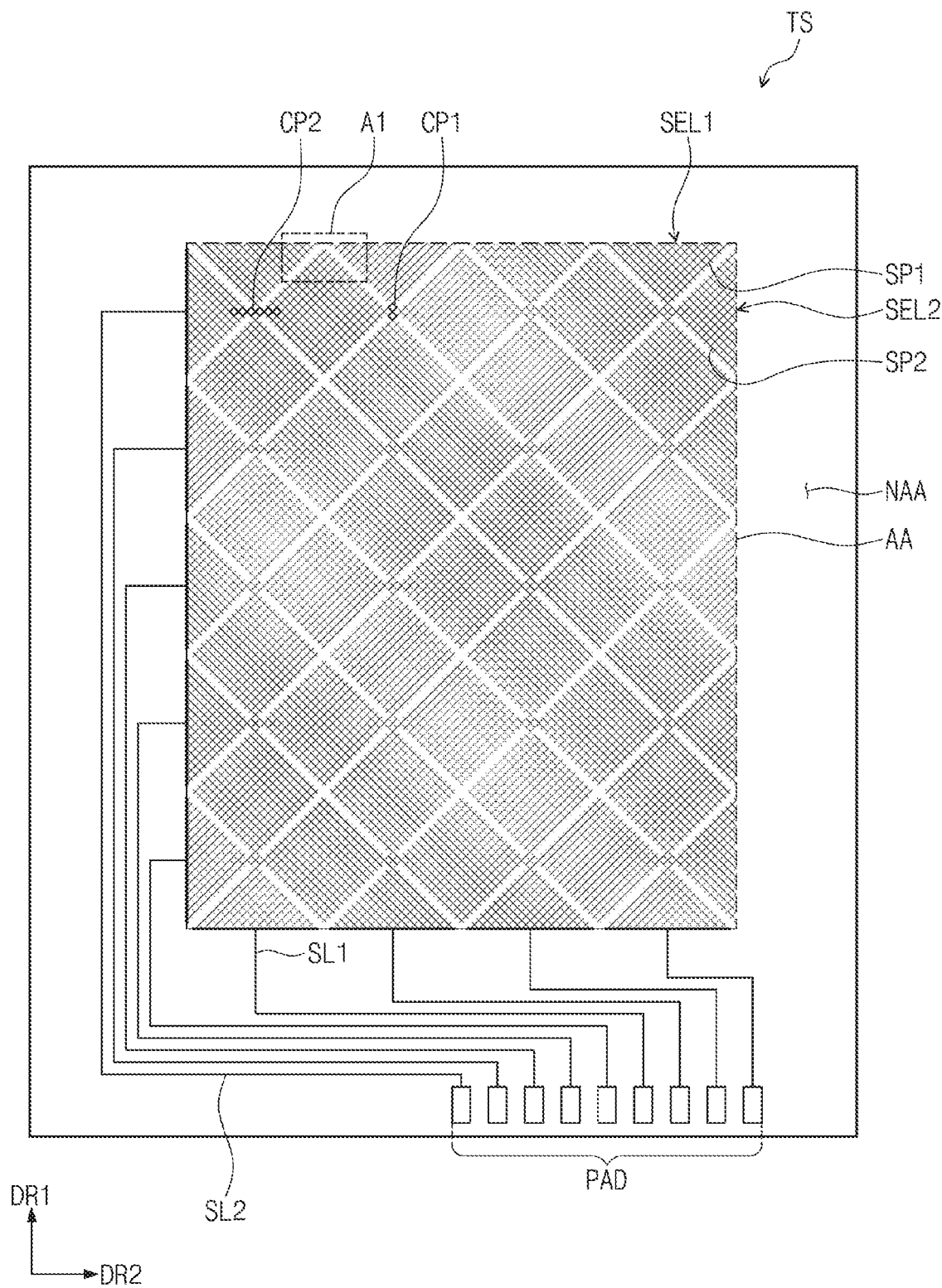
FIG. 14 is a diagram illustrating a planar structure of a touch sensing portion of FIG. 9.
Figure 15:
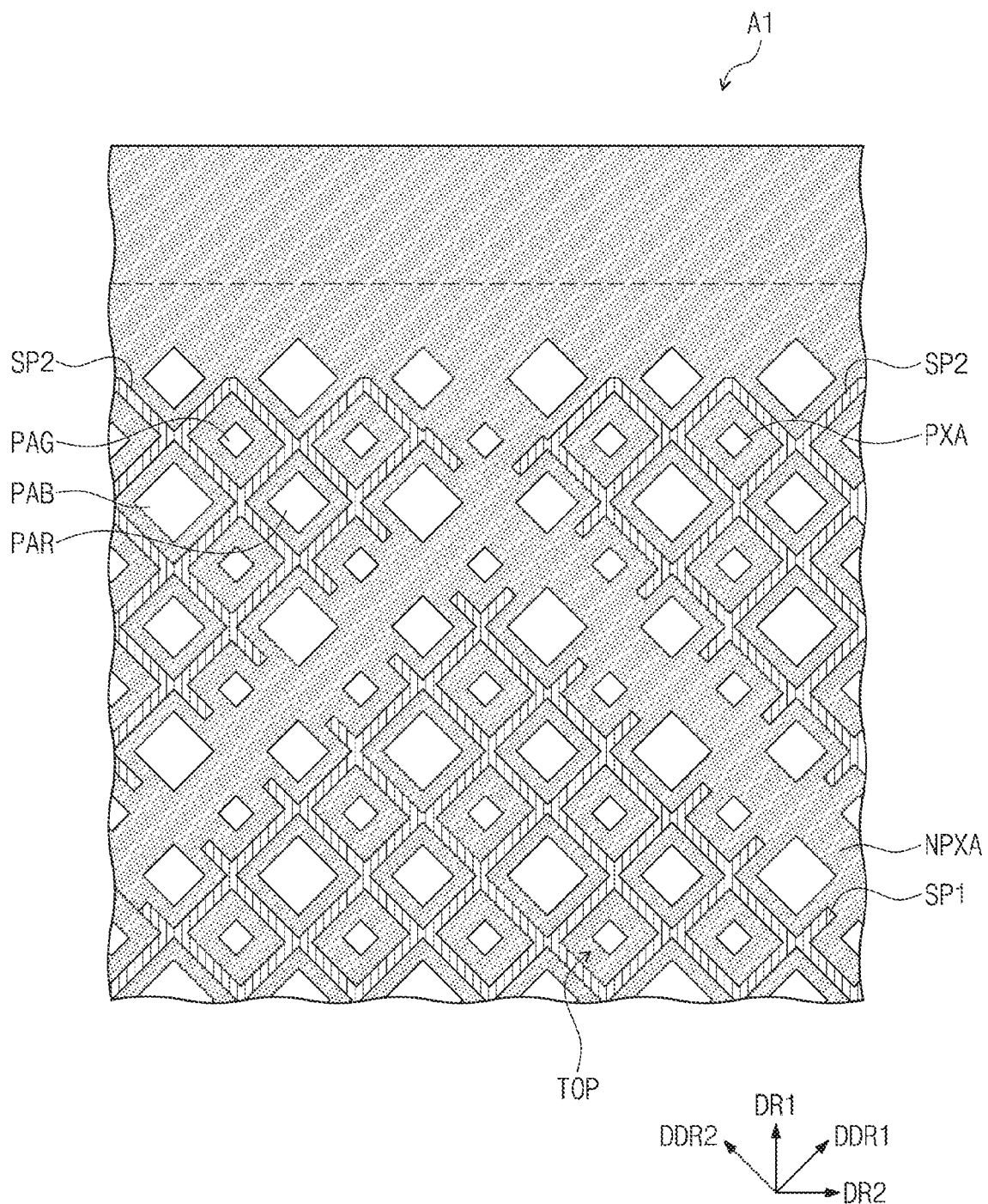
FIG. 15 is an enlarged plan view of a first region A1 of FIG. 14.

FIG. 14 is a diagram illustrating a planar structure of a touch sensing portion of FIG. 9. FIG. 15 is an enlarged plan view of a first region A1 of FIG. 14.

Referring to FIG. 14, the touch sensing portion TS may include a plurality of sensing electrodes SEL1 and SEL2, a plurality of interconnection lines SL1 and SL2, and a plurality of pads PAD. Although not shown, the touch sensing portion TS may be disposed on the thin encapsulation layer TFE. For example, the sensing electrodes SEL1 and SEL2, the interconnection lines SL1 and SL2, and the pads PAD may be disposed on the thin encapsulation layer TFE.

The sensing electrodes SEL1 and SEL2 and the interconnection lines SL1 and SL2 may have a single-layered structure or a multi-layered structure with upwardly stacked layers. The conductive layer of the multi-layered structure may include at least two conductive layers that are selected from transparent conductive layers and metal layers. The conductive layer of the multi-layered structure may include at least two metal layers containing different metals. Each of the transparent conductive layers may be formed of or include at least one of indium tin oxide (ITO), indium zinc oxide (IZO), zinc oxide (ZnO), indium tin zinc oxide (ITZO), PEDOT, metal nano wire, or graphene. The metal layer may be formed of or include at least one of molybdenum, silver, titanium, copper, aluminum, or alloys thereof.

The touch sensing portion TS may include an active region AA and a non-active region NAA surrounding the active region AA. The sensing electrodes SEL1 and SEL2 may be disposed in the active region AA, and the pads PAD may be disposed in the non-active region NAA. The interconnection lines SL1 and SL2 may be connected to the sensing electrodes SEL1 and SEL2, may be extended to the non-active region NAA, and may be connected to the pads PAD.

Although not shown, the pads PAD may be connected to a driving part, which is used to drive the touch sensing portion TS, through a flexible printed circuit board (not shown).

The sensing electrodes SEL1 and SEL2 may include a plurality of first sensing electrodes SEL1, which are extended in the first direction DR1 and are arranged in the second direction DR2, and a plurality of second sensing electrodes SEL2, which are extended in the second direction DR2 and are arranged in the first direction DR1. The interconnection lines SL1 and SL2 may include a plurality of first signal lines SL1 connected to the first sensing electrodes SEL1 and a plurality of second signal lines SL2 connected to the second sensing electrodes SEL2.

The first sensing electrodes SEL1 may be insulated from the second sensing electrodes SEL2 and may be extended to cross the second sensing electrodes SEL2. The first sensing electrodes SEL1 and the second sensing electrodes SEL2 may have a mesh construction. Capacitances may be formed by the first sensing electrodes SEL1 and the second sensing electrodes SEL2.

Each of the first sensing electrodes SEL1 may include a plurality of first sensor units SP1, which are arranged in the first direction DR1, and a plurality of first connecting portions CP1 connecting the first sensor units SP1. The first sensor units SP1 may have a mesh construction. Each of the first connecting portions CP1 may be disposed between two adjacent ones of the first sensor units SP1 and may electrically connect the two adjacent ones of the first sensor units SP1 to each other.

Each of the second sensing electrodes SEL2 may include a plurality of second sensor units SP2, which are arranged in the second direction DR2, and a plurality of second connecting portions CP2 connecting the second sensor units SP2. The second sensor units SP2 may have a mesh construction. Each of the second connecting portions CP2 may be disposed between two adjacent ones of the second sensor units SP2 and may electrically connect the two adjacent ones of the second sensor units SP2 to each other.

The first sensor units SP1 and the second sensor units SP2 may be spaced apart from each other, may not be overlapped with each other, and may be alternately disposed. The second connecting portions CP2 may be extended to cross the first connecting portions CP1 and to be electrically disconnected from the first connecting portions CP1. The first and second sensor units SP1 and SP2 and the second connecting portions CP2 may be disposed on the same layer. The first connecting portions CP1 may be disposed on a layer different from the first and second sensor units SP1 and SP2 and the second connecting portions CP2.

Although not shown, an insulating layer may be disposed between the first connecting portions CP1 and the second connecting portions CP2. The first connecting portions CP1 may be connected to the first sensor units SP1 through contact holes, which are defined in the insulating layer. The second connecting portions CP2 and the second sensor units SP2 may be formed to constitute a single object.

Referring to FIG. 15, each of the emission regions PXA may have substantially the same structure as the emission region PXA of FIG. 13. Each of the emission regions PXA may be configured to display a red, green, or blue color. However, the inventive concept is not limited to this example, and in an exemplary embodiment, the emission regions PXA may further include pixels to display magenta, cyan, or white color.

A size of each of the emission region PXA may vary depending on the color thereof. For example, a blue emission region PAB may be larger than a red emission region PAR, and the red emission region PAR may be larger than a green emission region PAG.

The emission regions PXA may have a diamond shape, but the inventive concept is not limited to this example. For example, the emission regions PXA may have various shapes such as circular and polygonal shapes. The emission regions PXA may be arranged in a first diagonal direction DDR1 and a second diagonal direction DDR2.

The first diagonal direction DDR1 may be defined as a direction which crosses the first and second directions DR1 and DR2 on a plane defined by the first and second directions DR1 and DR2. The second diagonal direction DDR2 may be a direction, which crosses the first diagonal direction DDR1 on the plane defined by the first and second directions DR1 and DR2. For example, the first direction DR1 and the second direction DR2 may be perpendicular to each other, and the first diagonal direction DDR1 and the second diagonal direction DDR2 may be perpendicular to each other.

The first and second sensor units SP1 and SP2 having a mesh construction may be overlapped with the non-emission region NPXA. Openings TOP, which are defined by the mesh structure, may have a diamond shape, which corresponds to the shape of the emission regions PXA, and may have a size corresponding to the emission regions PXA.

Since the first and second sensor units SP1 and SP2 are disposed in the non-emission region NPXA, light generated in the emission regions PXA may be normally emitted to the outside, without influence of the first and second sensor units SP1 and SP2.

Figure 16:
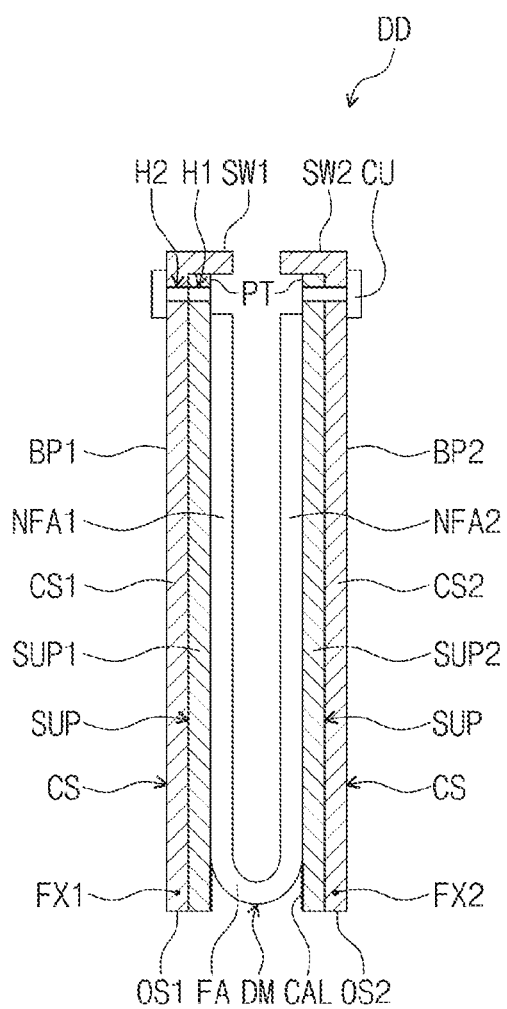
FIG. 16 is a sectional view illustrating a folded structure of the display device of FIG. 8.

FIG. 16 is a sectional view illustrating a folded structure of the display device of FIG. 8.

Referring to FIG. 16, the display device DD in an unfolded state may be folded by the first case CS1 and the second case CS2. For example, the first case CS1 may be rotated in a clockwise direction about a first folding axis FX1, which is provided in a portion of the first case CS1 adjacent to a side of the first case CS1. The second case CS2 may be rotated in a counterclockwise direction about a second folding axis FX2, which is provided in a portion of the second case CS2 adjacent to a side of the second case CS2.

Although not shown, a hinge structure, which provides the first and second folding axes FX1 and FX2 to the first and second cases CS1 and CS2, may be connected to the first and second cases CS1 and CS2. The first and second folding axes FX1 and FX2 may be parallel to the second direction DR2.

Due to the motion of the first and second cases CS1 and CS2, the folding region FA may be bent to have a downward convex shape, and thus, the display module DM may be folded. The display module DM may be folded in an in-folding manner that the display surface is not exposed to the outside.

Since the display module DM is a flexible display module, the folding region FA may be easily bent. However, since the first and second supporting portions SUP1 and SUP2 are rigid, they may not be bent. If portions of the first and second supporting portions SUP1 and SUP2 overlapped with the folding region FA are attached to the folding region FA, the folding of the display module DM may be difficult, owing to the first and second supporting portions SUP1 and SUP2.

According to an exemplary embodiment of the invention, since portions of the first and second supporting portions SUP1 and SUP2 overlapped with the folding region FA are not attached to the display module DM, the folding region FA may be easily bent.

Figure 17:
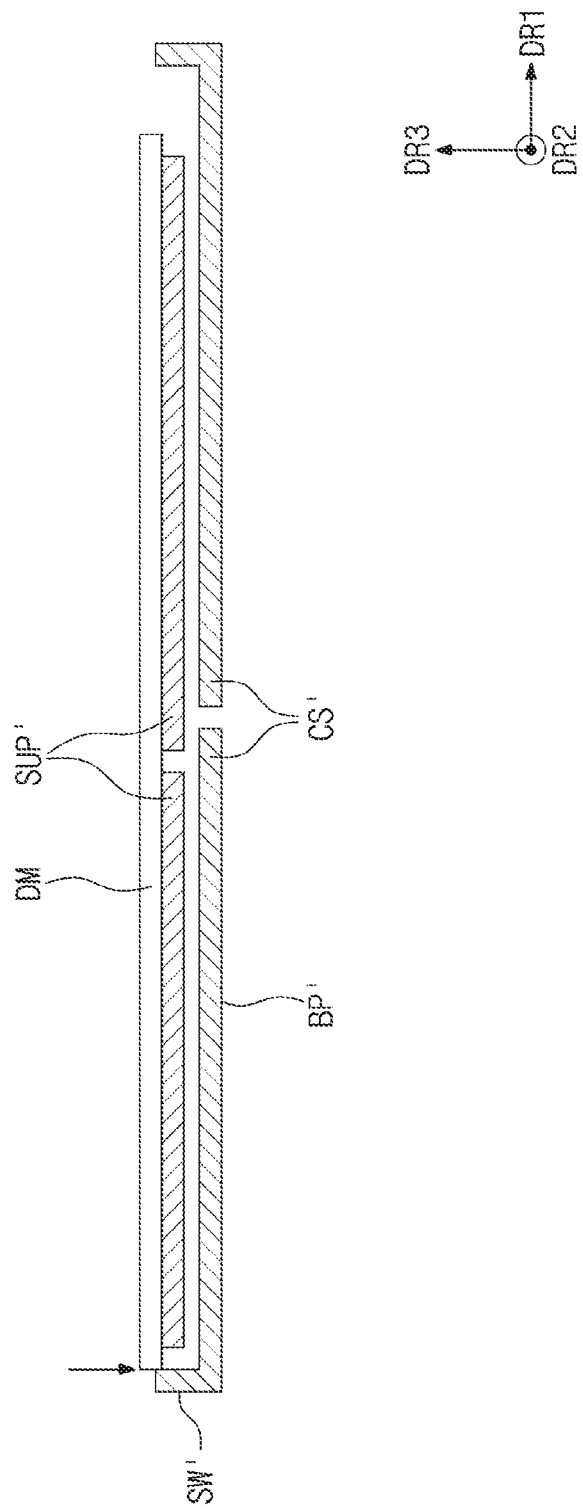
FIG. 17 is a diagram exemplarily illustrating a process of assembling a display device, in which a protruding portion is not included.

FIG. 17 is a diagram exemplarily illustrating a process of assembling a display device, in which a protruding portion is not included.

Referring to FIG. 17, a supporting portion SUP' may be attached to a bottom surface of the display module DM, and then, the supporting portion SUP' and the display module DM may be moved in a downward direction and may be contained in a case CS'. When the supporting portion SUP' and the display module DM are moved in a downward direction, the edge of the display module DM may be in contact with a sidewall portion SW' of the case CS', due to an error in position during a process. In this case, the supporting portion SUP' and the display module DM may be moved at a normal position, after mounting the supporting portion SUP' on a bottom portion BP'.

However, in the case where the edge of the display module DM is in contact with the sidewall portion SW' of the case CS', the edge of the display module DM may be damaged. The damaged portion may be expanded from the edge of the display module DM to an inner portion of the display module DM. This may lead to a failure of the display device.

Figure 18:
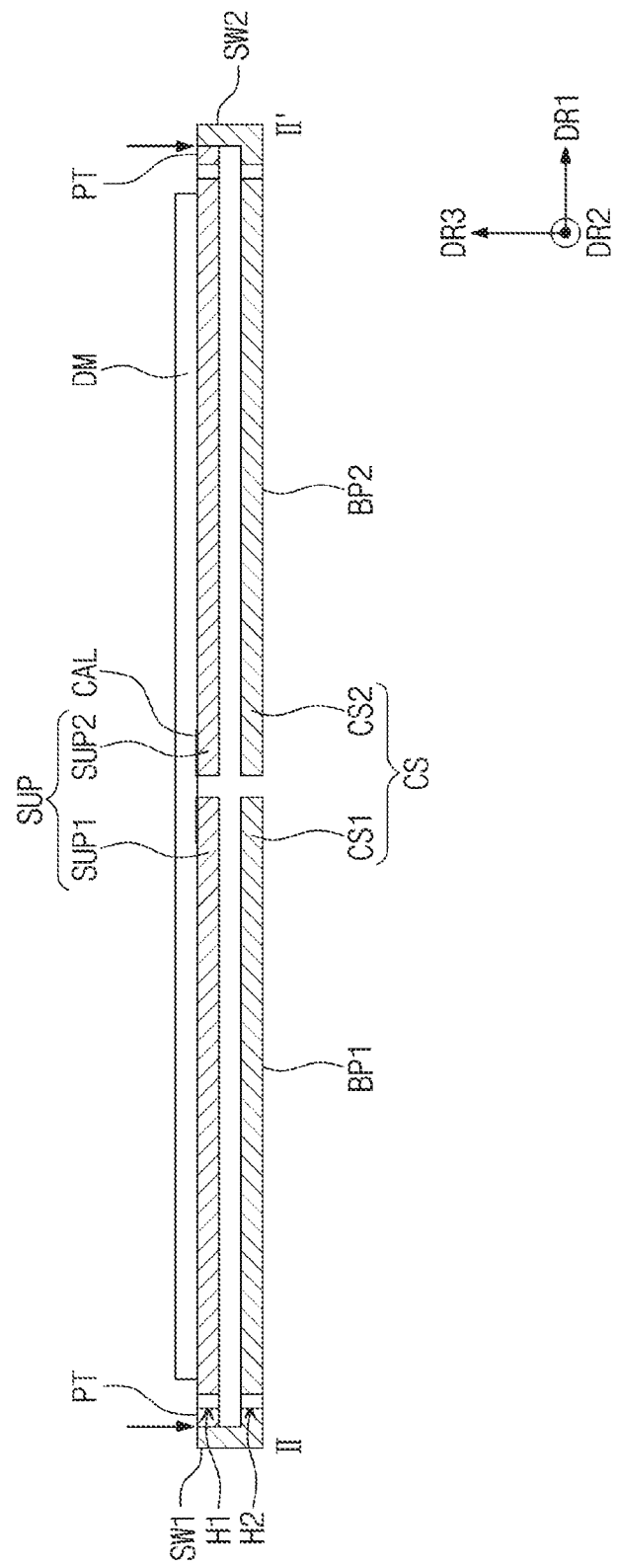
FIG. 18 is a diagram exemplarily illustrating a process of assembling a display device, according to an exemplary embodiment of the invention.

FIG. 18 is a diagram exemplarily illustrating a process of assembling a display device, according to an exemplary embodiment of the invention.

Referring to FIG. 18, the supporting portion SUP may be attached to a bottom surface of the display module DM, and then, the supporting portion SUP and the display module DM may be moved in a downward direction and may be contained in the case CS. When the supporting portion SUP and the display module DM are moved in the downward direction, the protruding portions PT, which protrude outward relative to the edge of the display module DM, may be in contact with the first and second sidewall portions SW1 and SW2.

Since the protruding portions PT are in contact with the first and second sidewall portions SW1 and SW2 beforehand during the downward motion of the display module DM, the edge of the display module DM may not be in contact with the first and second sidewall portions SW1 and SW2. That is, the protruding portions PT may guide the display module DM such that the edge of the display module DM is not in contact with the first and second sidewall portions SW1 and SW2. Since the edge of the display module DM is not in contact with the first and second sidewall portions SW1 and SW2, it may be possible to prevent the display module DM from being damaged.

As a result, in the display device DD according to an exemplary embodiment of the invention, it may be possible to prevent the display module DM from being damaged.

FIGS. 19 to 24 are plan views illustrating protruding portions according to various exemplary embodiments of the invention.

The structures shown in FIGS. 19 to 24 may substantially differ from the supporting portion SUP shown in FIG. 6 in terms of only positions of protruding portions PT_1-PT_6. Thus, the positions of the protruding portions PT_1-PT_6 will be mainly described below, and the supporting portion SUP of FIGS. 19 to 24 is illustrated to have the same structure as the supporting portion SUP of FIG. 6.

Figure 19:
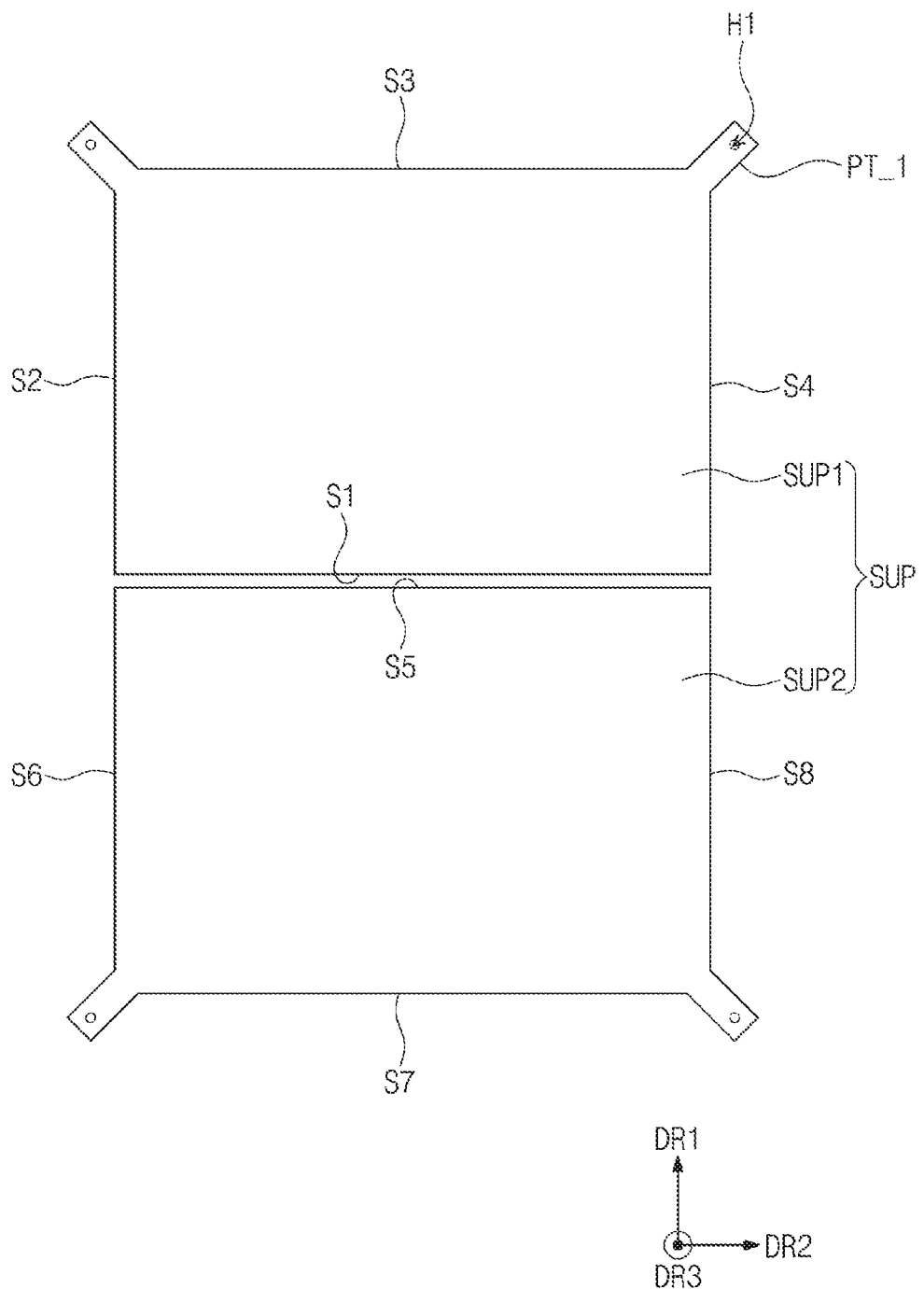
FIGS. 19, 20, 21, 22, 23, and 24 are plan views illustrating protruding portions according to various exemplary embodiments of the invention.

Referring to FIG. 19, the protruding portions PT_1 may protrude from vertices defined by the second, third, and fourth sides S2, S3, and S4 and from vertices defined by the sixth, seventh, and eighth sides S6, S7, and S8. As shown in the protruding portions PT of FIG. 6, the protruding portions PT_1 may have a rectangular or tetragonal shape, and the first hole H1 may be defined in each of the protruding portions PT_1.

Except for differences in their positions, the protruding portions PT_2-PT_6 to be described below may have substantially the same shape as the protruding portions PT shown in FIG. 6, and thus, a description of the shapes of the protruding portions PT_2-PT_6 will be omitted.

Figure 20:
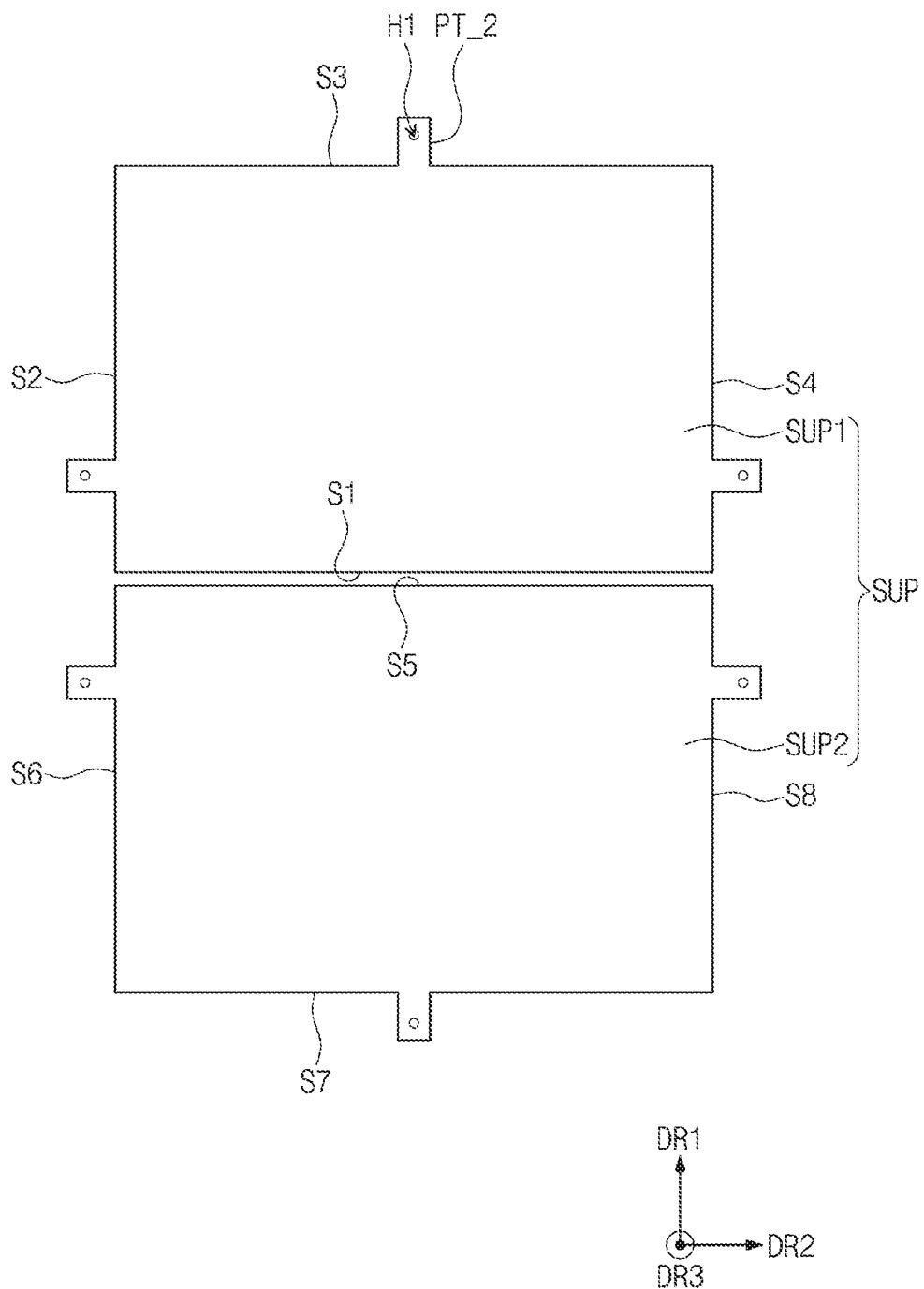

Referring to FIG. 20, the protruding portions PT_2 may protrude from the second side S2, the third side S3, the fourth side S4, the sixth side S6, the seventh side S7, and the eighth side S8.

Figure 21:
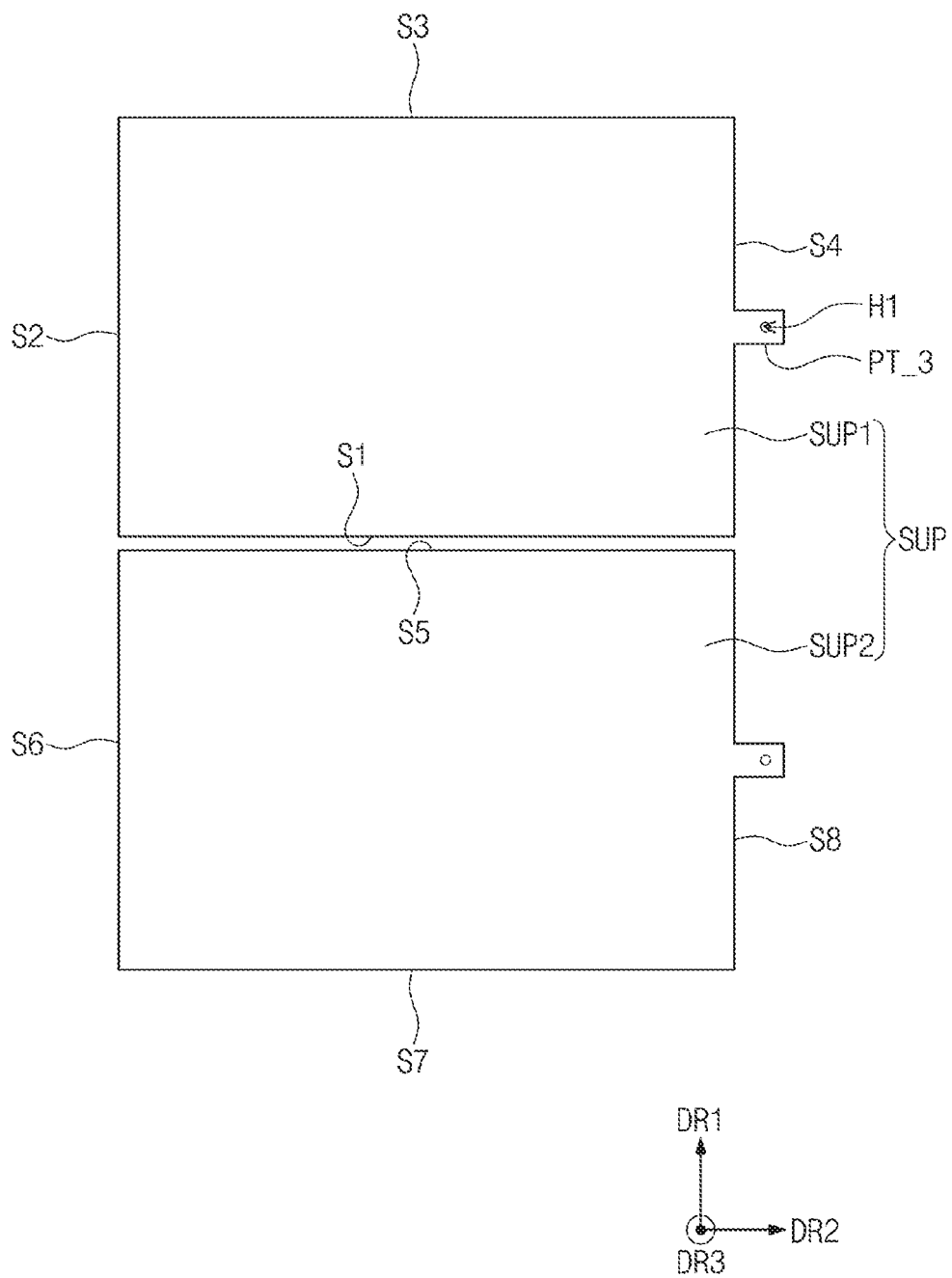

Referring to FIG. 21, the protruding portions PT_3 may protrude from one side of the second, third, and fourth sides S2, S3, and S4 and from one side of the sixth, seventh, and eighth sides S6, S7, and S8. For example, the protruding portions PT_3 may protrude from the fourth side S4 and the eighth side S8. However, the inventive concept is not limited to this example, and in an exemplary embodiment, the protruding portions PT_3 may protrude from one side of the second and third sides S2 and S3 and from one side of the sixth and seventh sides S6 and S7.

Figure 22:
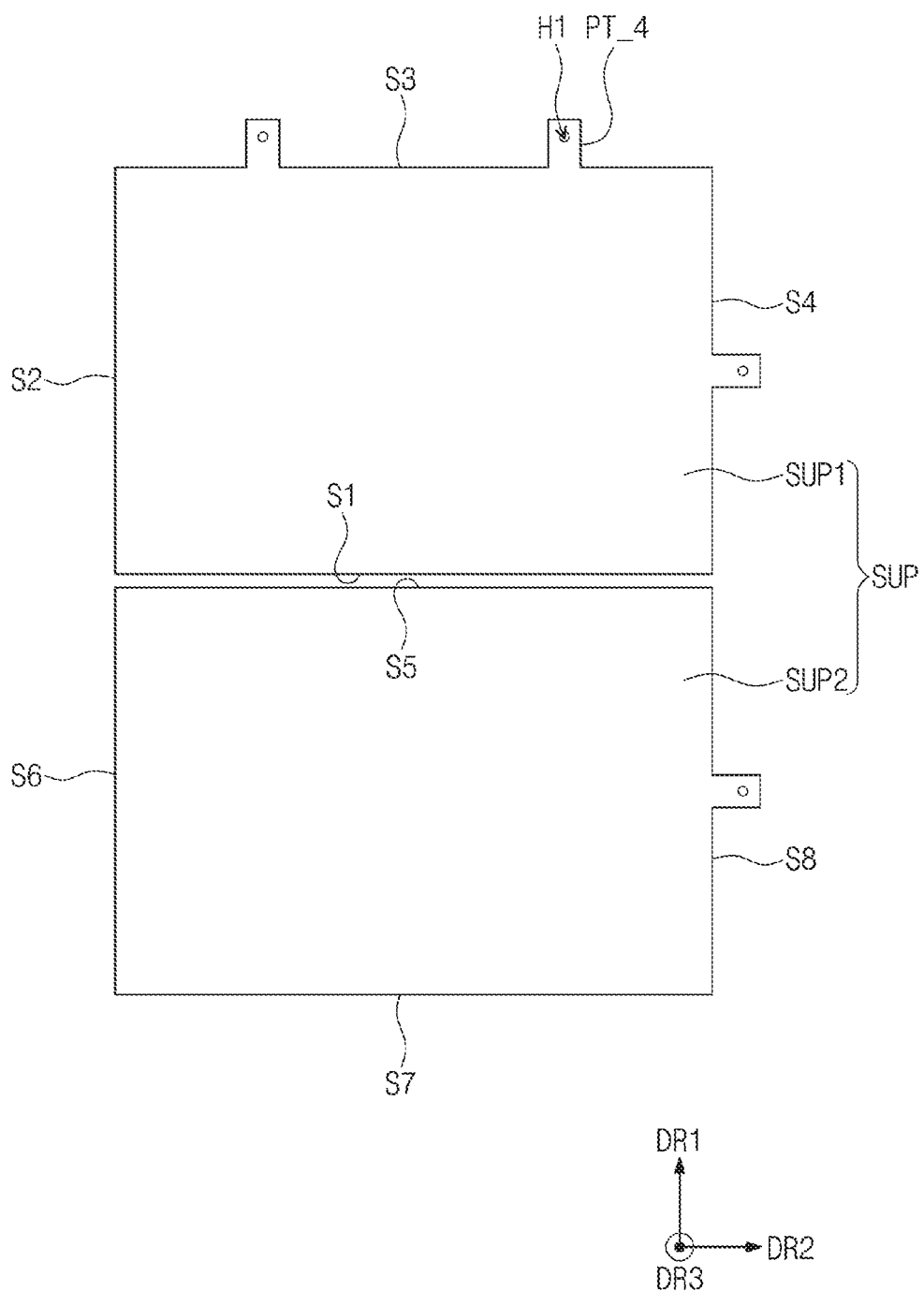

Referring to FIG. 22, the protruding portions PT_4 may protrude from two sides of the second, third, and fourth sides S2, S3, and S4 and from one side of the sixth, seventh, and eighth sides S6, S7, and S8. For example, the protruding portions PT_4 may protrude from the third side S3, the fourth side S4, and the eighth side S8.

As an example, a pair of the protruding portions PT_4 may protrude from the third side S3, and one protruding portion PT_4 may protrude from each of the fourth and eighth sides S4 and S8. However, the number of the protruding portions PT_4 is not limited thereto.

Figure 23:
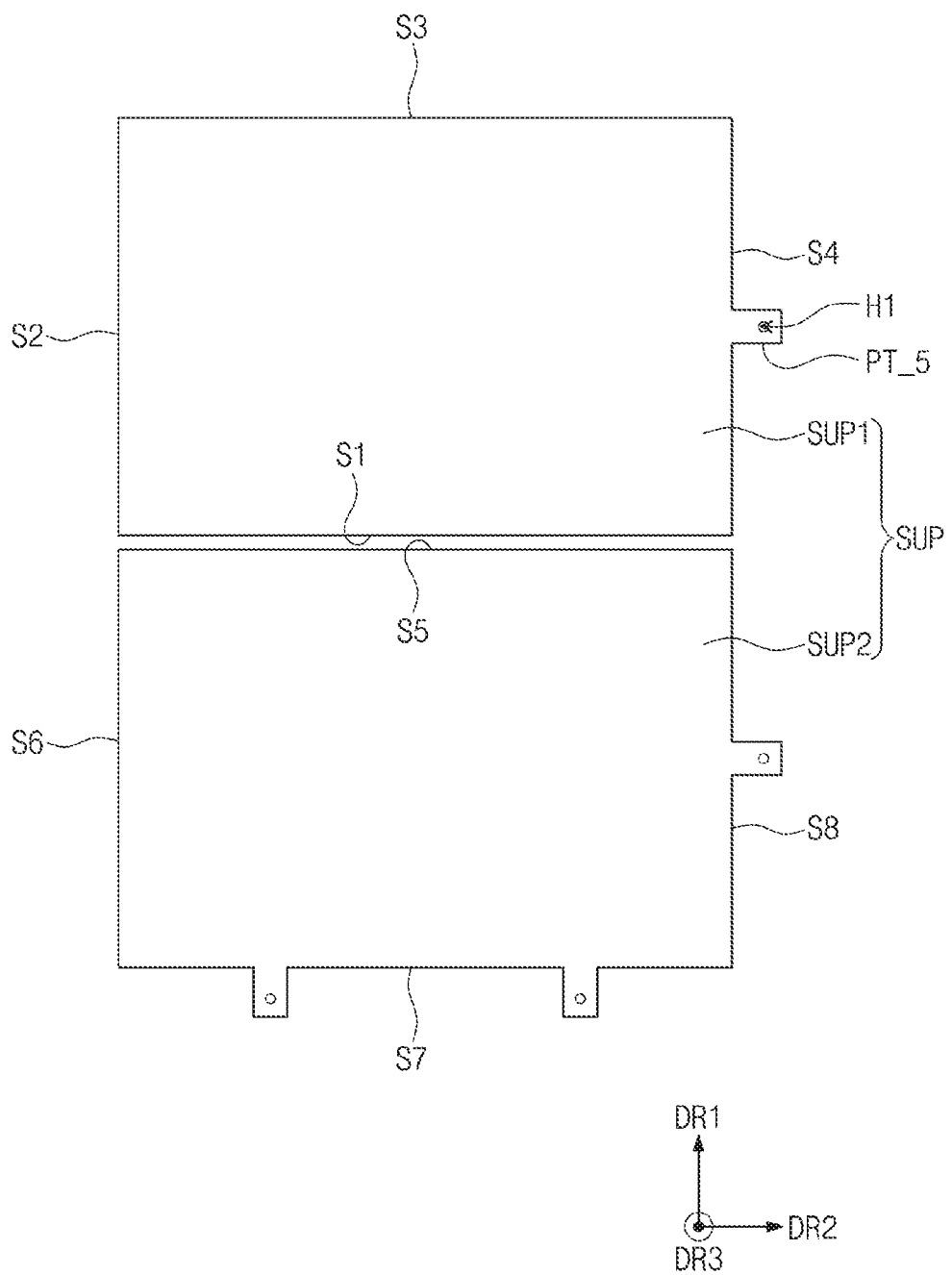

Referring to FIG. 23, the protruding portions PT_5 may protrude from one side of the second, third, and fourth sides S2, S3, and S4 and from two sides of the sixth, seventh, and eighth sides S6, S7, and S8. For example, the protruding portions PT_5 may protrude from the fourth side S4, the seventh side S7, and the eighth side S8.

Figure 24:
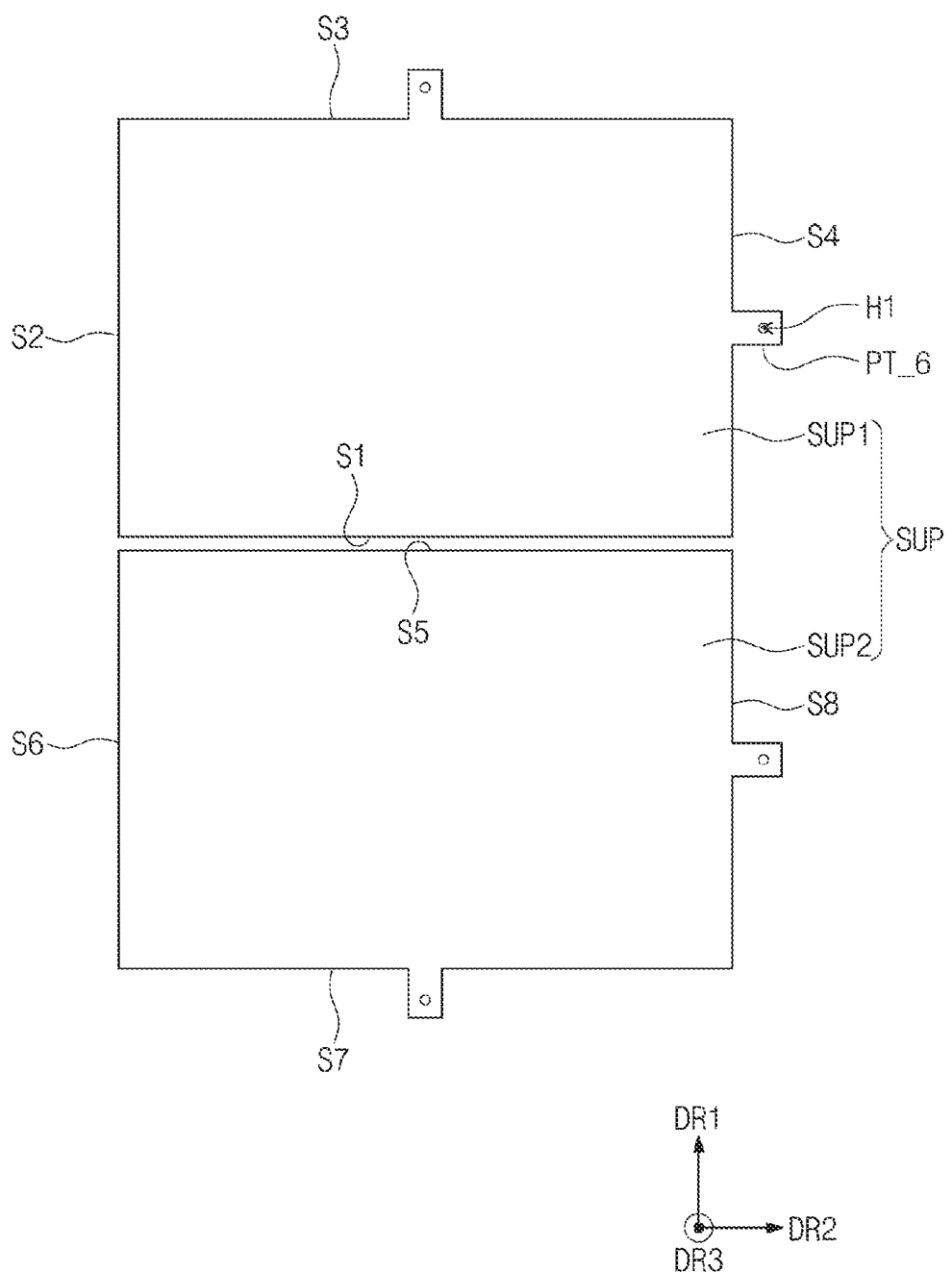

Referring to FIG. 24, the protruding portions PT_6 may protrude from two sides of the second, third, and fourth sides S2, S3, and S4 and from two sides of the sixth, seventh, and eighth sides S6, S7, and S8. For example, the protruding portions PT_6 may protrude from the third side S3, the fourth side S4, the seventh side S7, and the eighth side S8.

FIGS. 25 to 29 are diagrams illustrating planar structures of supporting portions according to various exemplary embodiments of the invention.

For convenience in description and illustration, in FIGS. 25 to 29, the display module DM is illustrated along with supporting portions SUP_1-SUP_5 and portions of the supporting portions SUP_1-SUP_5 veiled by the display module DM are depicted by dotted lines. Substantially, the supporting portions SUP_1-SUP_5 shown in FIGS. 25 to 29 may play the same role as the protruding portions PT, and this will be described in more detail below.

Figure 25:
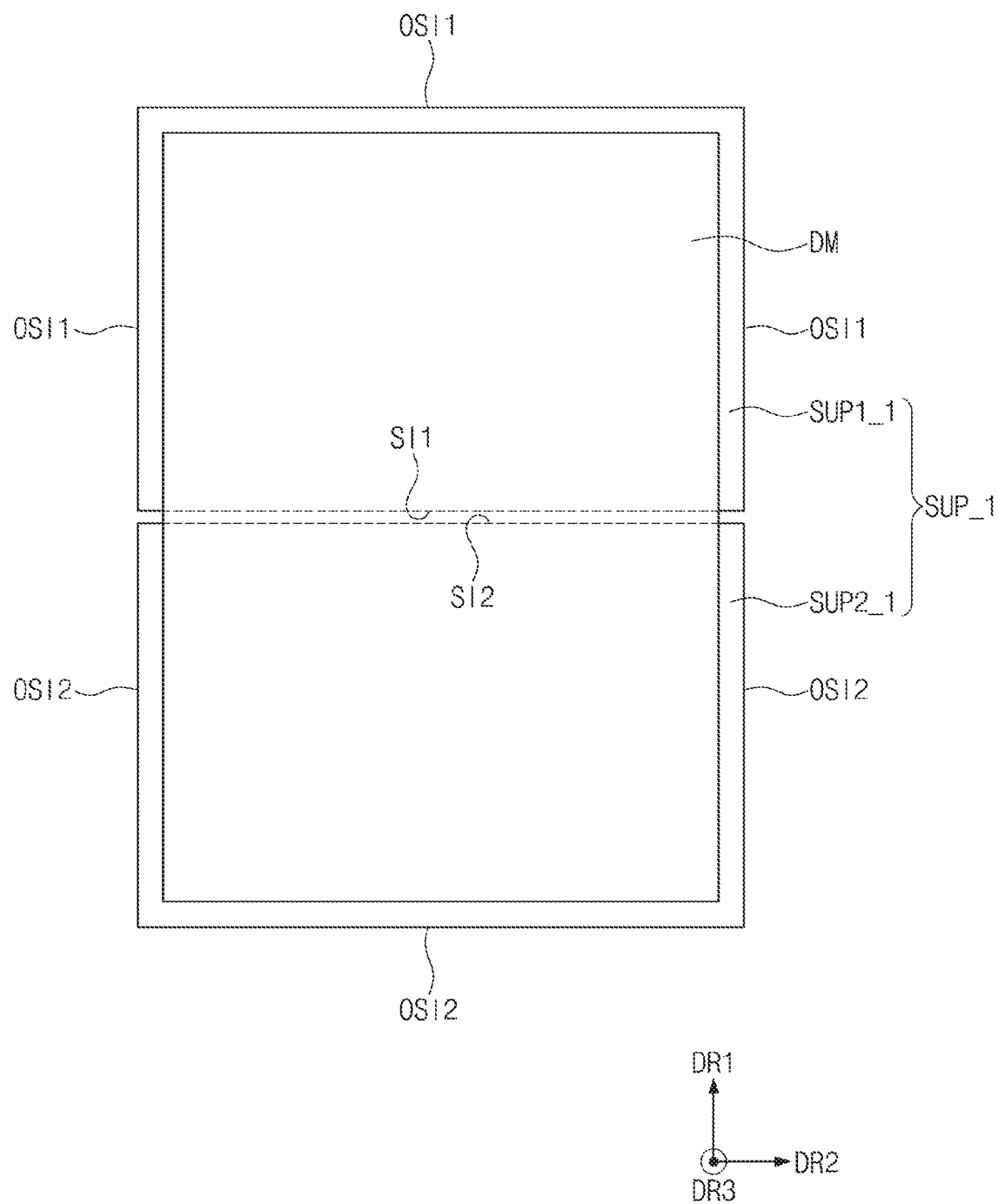
FIGS. 25, 26, 27, 28, and 29 are diagrams illustrating planar structures of supporting portions according to various exemplary embodiments of the invention.

Referring to FIG. 25, the supporting portion SUP_1 may include a first supporting portion SUP1_1 and a second supporting portion SUP2_1, which are arranged in the first direction DR1. A one side SI1 of the first supporting portion SUP1_1 and a one side SI2 of the second supporting portion SUP2_1 may face each other.

Other sides OSI1 of the first supporting portion SUP1_1, except the one side SI1 of the first supporting portion SUP1_1, and other sides OSI2 of the second supporting portion SUP2_1, except the one side SI2 of the second supporting portion SUP2_1, may be extended to an outer region beyond the edge of the display module DM.

Although not shown, the other sides OSI1 of the first supporting portion SUP1_1 and the other sides OSI2 of the second supporting portion SUP2_1 may be adjacent to the first and second sidewall portions SW1 and SW2 of the case CS shown in FIG. 5. As an example, the other sides OSI1 of the first supporting portion SUP1_1 and the other sides OSI2 of the second supporting portion SUP2_1 may be in contact with the first and second sidewall portions SW1 and SW2. Thus, owing to the first and second supporting portions SUP1_1 and SUP2_1, the display module DM may be prevented from being in contact with the first and second sidewall portions SW1 and SW2.

Figure 26:
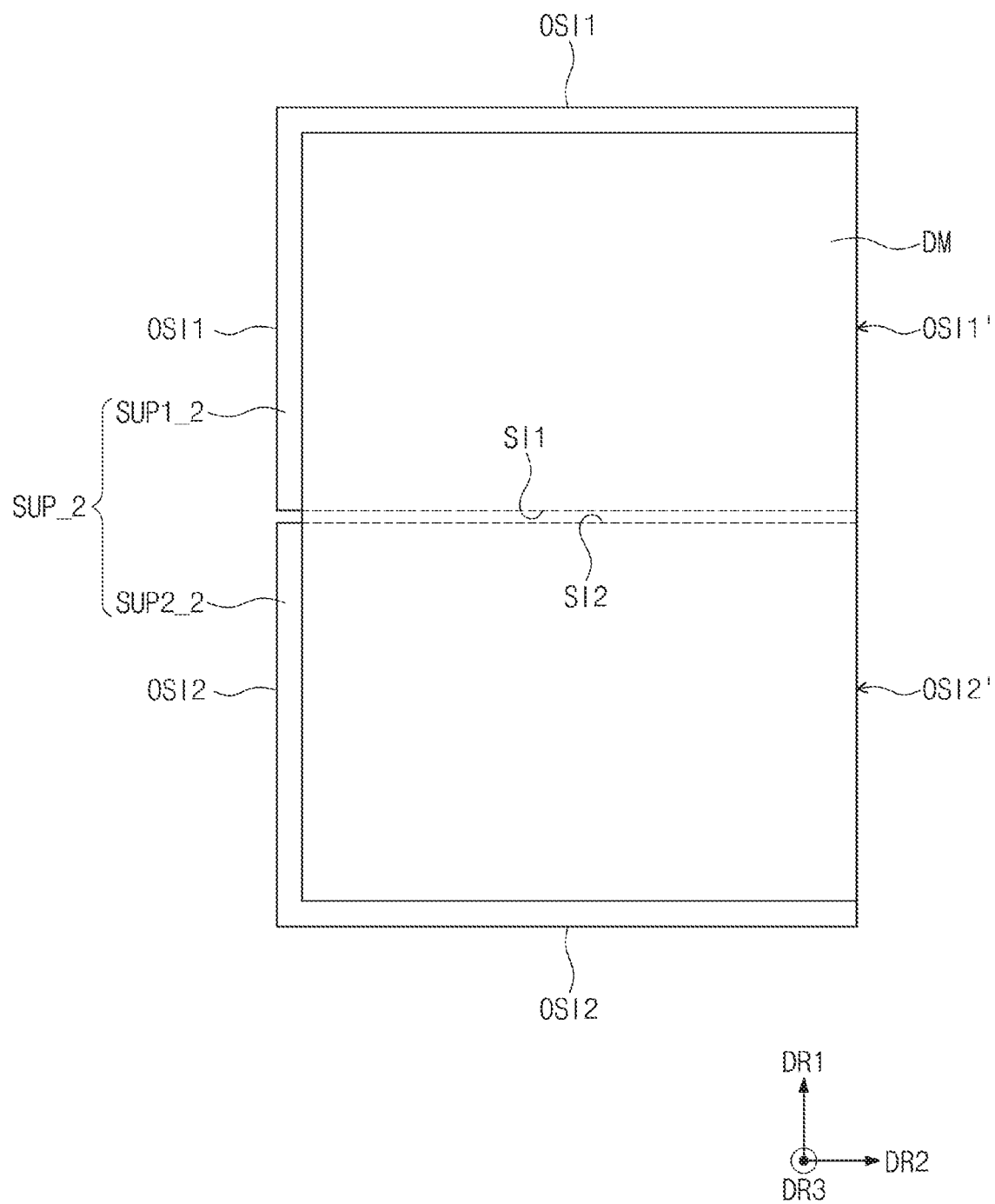

Referring to FIG. 26, a supporting portion SUP_2 may include a first supporting portion SUP1_2 and a second supporting portion SUP2_2, which are arranged in the first direction DR1. At least two sides OSI1 of the other sides OSI1 and OSI1' of the first supporting portion SUP1_2 and at least two sides OSI2 of the other sides OSI2 and OSI2' of the second supporting portion SUP2_2 may be extended to an outer region beyond the edge of the display module DM. The two sides OSI1 may be adjacent to each other, and the two sides OSI2 may be adjacent to each other.

Figure 27:
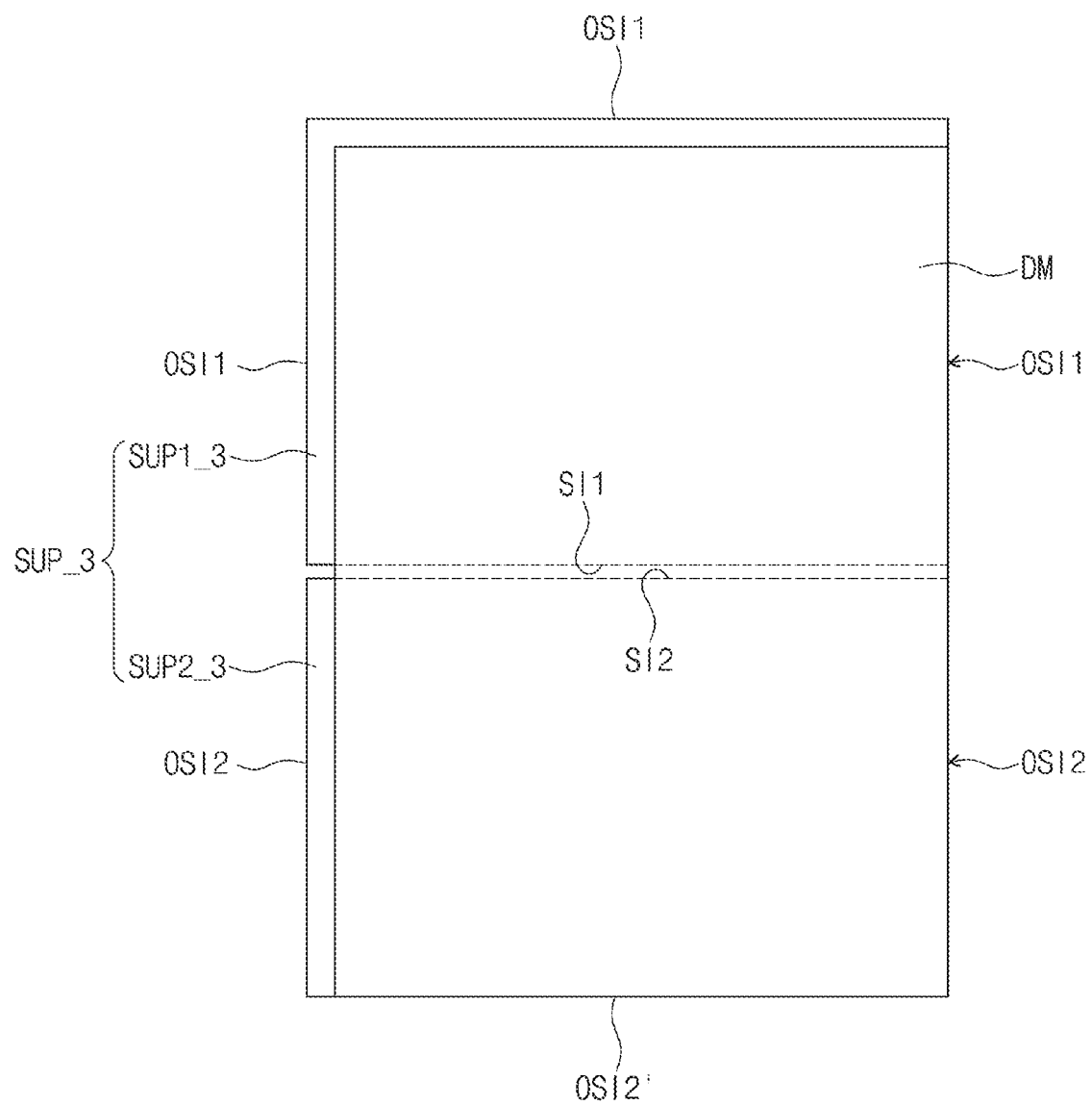

Referring to FIG. 27, a supporting portion SUP_3 may include a first supporting portion SUP1_3 and a second supporting portion SUP2_3, which are arranged in the first direction DR1. At least two sides OSI1 of the other sides OSI1 and OSI1' of the first supporting portion SUP1_3 and at least one side OSI2 of the other sides OSI2 and OSI2' of the second supporting portion SUP2_3 may be extended to an outer region beyond the edge of the display module DM. The two sides OSI1 may be adjacent to each other.

Figure 28:
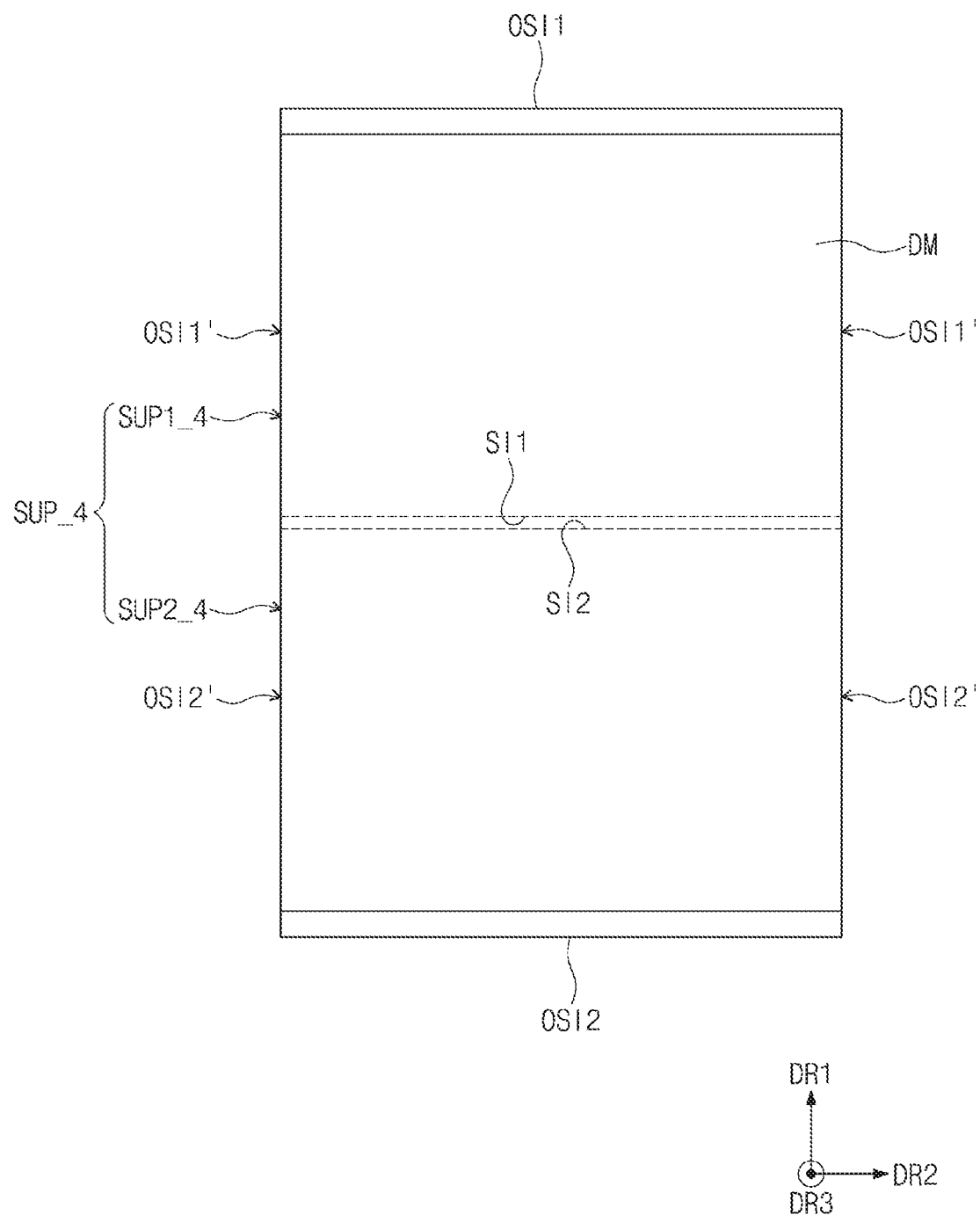

Referring to FIG. 28, a supporting portion SUP_4 may include a first supporting portion SUP1_4 and a second supporting portion SUP2_4, which are arranged in the first direction DR1. At least one side OSI1 of the other sides OSI1 and OSI1' of the first supporting portion SUP1_4 and at least one side OSI2 of the other sides OSI2 and OSI2' of the second supporting portion SUP2_4 may be extended to an outer region beyond the edge of the display module DM. The one side OSI1 and the one side OSI2 may be disposed to face each other.

Figure 29:
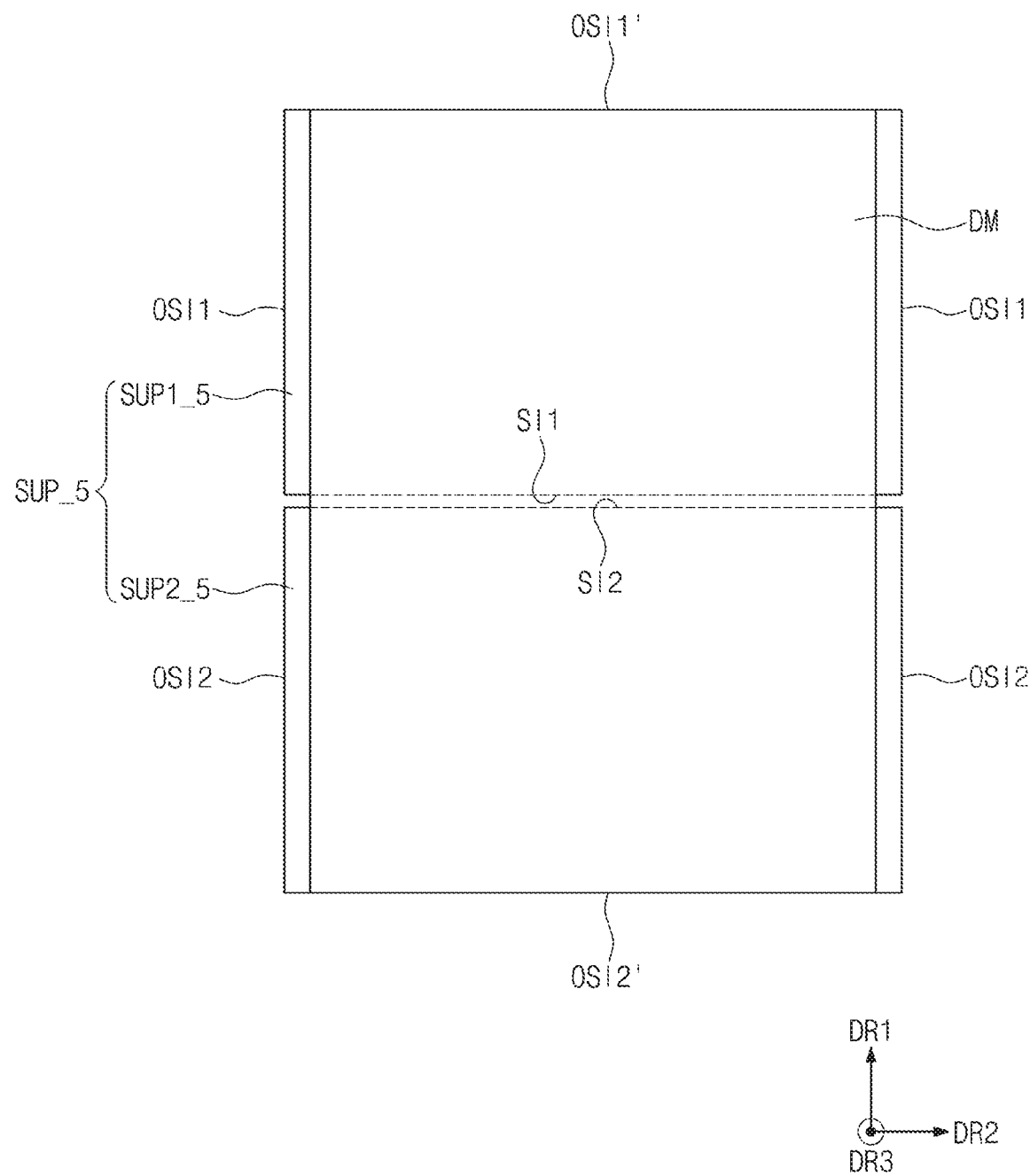

Referring to FIG. 29, the supporting portion SUP_5 may include a first supporting portion SUP1_5 and a second supporting portion SUP2_5, which are arranged in the first direction DR1. At least two sides OSI1 of the other sides OSI1 and OSI1' of the first supporting portion SUP1_5 and at least two sides OSI2 of the other sides OSI2 and OSI2' of the second supporting portion SUP2_5 may be extended to an outer region beyond the edge of the display module DM. The two sides OSI1 may not be adjacent to each other and may be disposed to face each other. The two sides OSI2 may not be adjacent to each other and may be disposed to face each other.

According to an exemplary embodiment of the invention, a supporting portion may include protruding portions, which are extended from an edge to an outer region beyond an edge of a display module and are in contact with a sidewall portion of a case located outside the display module. In this case, as a result of the presence of the protruding portions, the edge of the display module is prevented from being in contact with the sidewall portion of the case, and thus, it may be possible to prevent the display module from being damaged.

Although certain exemplary embodiments have been described herein, other embodiments and modifications will be apparent from this description. Accordingly, the inventive concepts are not limited to such embodiments, but rather to the broader scope of the appended claims and various obvious modifications and equivalent arrangements as would be apparent to a person of ordinary skill in the art.

What is claimed is:

1. A display device, comprising:
a display module;
a supporting portion disposed below the display module;
a plurality of protruding portions protruding from an edge of the supporting portion; and
a case containing the display module, the supporting portion, and the protruding portions,
wherein:
the case comprises:
a bottom portion disposed below the supporting portion; and
a sidewall portion spaced apart from an edge of the display module and extended along the edge of the display module;
the protruding portions protrude outward relative to the edge of the display module and are adjacent to the sidewall portion; and
an end of at least one protrusion of the protrusions extends parallel to the sidewall portion adjacent to the at least one protrusion.

2. The display device of claim 1, wherein the supporting portion has a rectangular or tetragonal shape, and the protruding portions protrude from at least one vertex of the supporting portion and at least one side of the supporting portion.

3. The display device of claim 1, wherein the protruding portions have a rectangular or tetragonal shape.

4. The display device of claim 1, wherein the edge of the supporting portion is disposed inside the edge of the display module.

5. The display device of claim 1, wherein the protruding portions are in contact with the sidewall portion.

6. The display device of claim 1, wherein the protruding portions are connected to the bottom portion.

7. The display device of claim 1, further comprising a plurality of coupling units inserted in first holes, which are defined in the protruding portions, and second holes, which are defined in the bottom portion and are overlapped with the first holes.

8. The display device of claim 1, wherein:
the display module comprises:
   a first non-folding region;
   a second non-folding region arranged in a first direction with a first non-folding region; and
   a folding region disposed between the first non-folding region and the second non-folding region; and
the supporting portion comprises:
   a first supporting portion disposed below the first non-folding region; and
   a second supporting portion disposed below the second non-folding region.

9. The display device of claim 8, wherein:
the case further comprises:
   a first case disposed below the first supporting portion; and
   a second case disposed below the second supporting portion; and
the first and second cases are rotated about a first folding axis, which is provided in a portion of the first case adjacent to a side of the first case, and a second folding axis, which is provided in a portion of the second case adjacent to a side of the second case, when the display module is folded.

10. The display device of claim 9, wherein:
the first case comprises:
   a first bottom portion disposed below the first supporting portion; and
   a first sidewall portion extended from other sides of the first bottom portion, except one side of the first bottom portion, in an upward direction;
the second case comprises:
   a second bottom portion disposed below the second supporting portion; and
   a second sidewall portion extended from other sides of the second bottom portion, except one side of the second bottom portion, in the upward direction;
the one side of the first bottom portion faces the one side of the second bottom portion;
the first and second bottom portions define the bottom portion; and
the first and second sidewall portions define the sidewall portion.

11. The display device of claim 10, wherein, when viewed in a plan view, each of the first and second bottom portions has an area that is larger than a corresponding one of the first and second supporting portions.

12. The display device of claim 8, wherein:
the first supporting portion comprises first to fourth sides, which are connected to each other to form a rectangular or tetragonal shape;
the second supporting portion comprises fifth to eighth sides, which are connected to each other to form a rectangular or tetragonal shape;
the first side faces the fifth side;
the first and third sides are opposite to each other and are extended in a second direction crossing the first direction;
the second and fourth sides are opposite to each other and are extended in the first direction;
the fifth and seventh sides are opposite to each other and are extended in the second direction;
the sixth and eighth sides are opposite to each other and are extended in the first direction; and
the edge of the supporting portion is defined by the second, third, fourth, sixth, seventh, and eighth sides.

13. The display device of claim 12, wherein the protruding portions protrude from one vertex of vertices defined by the second to fourth sides, one side of the second to fourth sides, one vertex of vertices defined by the sixth to eighth sides, and one side of the sixth to eighth sides.

14. The display device of claim 12, wherein the protruding portions protrude from a vertex defined by the second side and the third side, the fourth side, a vertex defined by the sixth side and the seventh side, and the eighth side.

15. The display device of claim 12, wherein the protruding portions protrude from vertices defined by the second to fourth sides and vertices defined by the sixth to eighth sides.

16. The display device of claim 12, wherein the protruding portions protrude from the second side, the third side, the fourth side, the sixth side, the seventh side, and the eighth side.

17. The display device of claim 12, wherein the protruding portions protrude from one side of the second, third, and fourth sides and one side of the sixth, seventh, and eighth sides.

18. The display device of claim 12, wherein the protruding portions protrude from two sides of the second, third, and fourth sides and one side of the sixth, seventh, and eighth sides.

19. The display device of claim 12, wherein the protruding portions protrude from one side of the second, third, and fourth sides and two sides of the sixth, seventh, and eighth sides.

20. The display device of claim 12, wherein the protruding portions protrude from two sides of the second, third, and fourth sides and two sides of the sixth, seventh, and eighth sides.

21. A display device, comprising:
   a display module including a first non-folding region, a second non-folding region, and a folding region disposed between the first and second non-folding regions;
   a first supporting portion disposed below the first non-folding region;
   a second supporting portion disposed below the second non-folding region; and
   a case disposed below the first and second supporting portions,
wherein:
the case comprises:
   a bottom portion disposed below the first and second supporting portions; and
   a sidewall portion spaced apart from an edge of the display module and extended along the edge of the display module;
a first side of the first supporting portion faces a first side of the second supporting portion;
at least one side of other sides of the first supporting portion, except the first side of the first supporting portion, and at least one side of other sides of the second supporting portion, except the first side of the second supporting portion, are extended outward relative to the edge of the display module;
the at least one side of the first supporting portion and the at least one side of the second supporting portion are adjacent to the sidewall portion; and
the at least one side of the first supporting portion and the at least one side of the second supporting portion extend parallel to the adjacent sidewall portion.

22. The display device of claim 21, wherein the other sides of the first supporting portion and the other sides of the second supporting portion are extended to an outer region beyond the edge of the display module.

23. The display device of claim 21, wherein at least two sides of the other sides of the first supporting portion are extended to an outer region beyond the edge of the display module.

24. The display device of claim 23, wherein at least two sides of the other sides of the second supporting portion are extended to an outer region beyond the edge of the display module.

25. A display device, comprising:
a display module;
a supporting portion disposed below the display module;
a plurality of protruding portions protruding from an edge of the supporting portion; and
a case disposed below the supporting portion to contain the display module, the supporting portion, and the protruding portions,
wherein:
the protruding portions are extended outward relative to an edge of the display module and is connected to the case; and
an end of at least one protrusion of the protrusions extends parallel to an edge of the case adjacent to the at least one protrusion.

26. The display device of claim 25, wherein the case comprises:
a bottom portion disposed below the supporting portion; and
a sidewall portion extended upward from an edge of the bottom portion and spaced apart from the edge of the display module,
wherein the protruding portions are adjacent to the sidewall portion and are connected to the bottom portion.

* * * * *